(12) United States Patent
Kadoguchi et al.

(10) Patent No.: US 9,831,160 B2
(45) Date of Patent: *Nov. 28, 2017

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Takuya Kadoguchi, Toyota (JP); Takahiro Hirano, Toyota (JP); Takanori Kawashima, Anjo (JP); Tomomi Okumura, Chiryu (JP); Masayoshi Nishihata, Nagoya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/398,178

(22) Filed: Jan. 4, 2017

(65) Prior Publication Data

US 2017/0117212 A1 Apr. 27, 2017

Related U.S. Application Data

(63) Continuation of application No. 14/916,136, filed as application No. PCT/IB2014/001646 on Aug. 29, 2014.

(30) Foreign Application Priority Data

Sep. 5, 2013 (JP) .................................. 2013-184472

(51) Int. Cl.
*H01L 23/34* (2006.01)
*H01L 23/495* (2006.01)
(Continued)

(52) U.S. Cl.
CPC ...... *H01L 23/49568* (2013.01); *H01L 23/051* (2013.01); *H01L 23/49513* (2013.01);
(Continued)

(58) Field of Classification Search
None
See application file for complete search history.

(56) References Cited

U.S. PATENT DOCUMENTS

| 6,353,258 B1 | 3/2002 | Inoue et al. |
| 2003/0001286 A1* | 1/2003 | Kajiwara ............. H01L 21/563 257/778 |

(Continued)

FOREIGN PATENT DOCUMENTS

| JP | H08-195471 A | 7/1996 |
| JP | 2004-335776 A | 11/2004 |

(Continued)

OTHER PUBLICATIONS

Sep. 22, 2016 Office Action Issued in U.S. Appl. No. 14/916,136.
Mar. 23, 2017 Office Action Issued in U.S. Appl. No. 14/916,136.

*Primary Examiner* — Andy Huynh
*Assistant Examiner* — Sitaramarao S Yechuri
(74) *Attorney, Agent, or Firm* — Oliff PLC

(57) ABSTRACT

A semiconductor device includes: opposed first and second metal plates; a plurality of semiconductor elements each interposed between the first metal plate and the second metal plate; a metal block interposed between the first metal plate and each of the semiconductor elements; a solder member interposed between the first metal plate and the metal block and connecting the first metal plate to the metal block; and a resin molding sealing the semiconductor elements and the metal block. A face of the first metal plate, which is on an opposite side of a face of the first metal plate to which the metal block is connected via the solder member, is exposed from the resin molding. The first metal plate has a groove formed along an outer periphery of a region in which the solder member is provided, the groove collectively surrounding the solder member.

3 Claims, 14 Drawing Sheets

(51) Int. Cl.
  *H01L 23/051* (2006.01)
  *H01L 23/00* (2006.01)
(52) U.S. Cl.
  CPC .. H01L 23/49524 (2013.01); H01L 23/49537 (2013.01); H01L 23/49548 (2013.01); H01L 23/49562 (2013.01); H01L 23/49575 (2013.01); H01L 24/29 (2013.01); H01L 24/32 (2013.01); H01L 24/33 (2013.01); *H01L 2224/29111* (2013.01); *H01L 2224/32245* (2013.01); *H01L 2224/33181* (2013.01)

(56) References Cited

U.S. PATENT DOCUMENTS

| | | | |
|---|---|---|---|
| 2004/0262781 A1 | 12/2004 | Germain et al. | |
| 2006/0046352 A1* | 3/2006 | Low | H01L 21/563 438/127 |
| 2007/0057373 A1* | 3/2007 | Okumura | H01L 23/051 257/746 |
| 2010/0289127 A1* | 11/2010 | Kanazawa | H01L 21/4842 257/666 |
| 2011/0199736 A1* | 8/2011 | Sawada | H05K 7/20909 361/722 |
| 2012/0306087 A1* | 12/2012 | Bayerer | H01L 23/15 257/772 |
| 2013/0026655 A1 | 1/2013 | Lee et al. | |

FOREIGN PATENT DOCUMENTS

| | | |
|---|---|---|
| JP | 2005-174998 A | 6/2005 |
| JP | 2006-156606 A | 6/2006 |
| JP | 2007-103909 A | 4/2007 |
| JP | 4702196 B2 | 6/2011 |
| JP | 2014-093356 A | 5/2014 |
| WO | 2012/143784 A2 | 10/2012 |

* cited by examiner

FIG. 8A
FIG. 8B
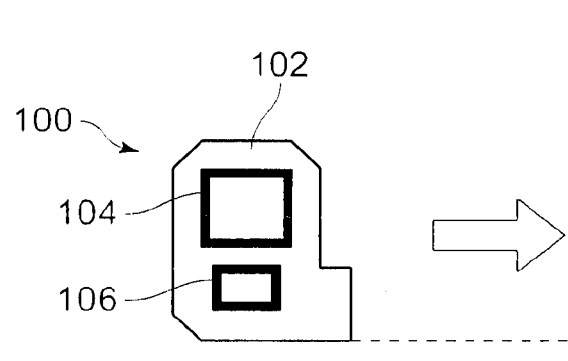
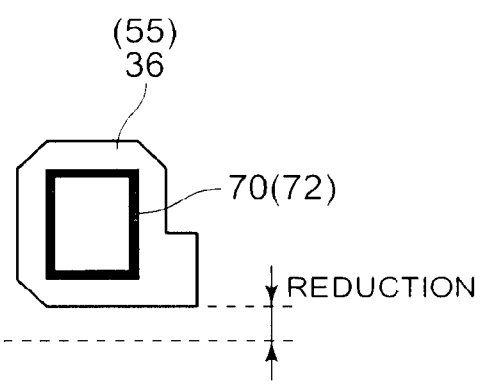

FIG. 15
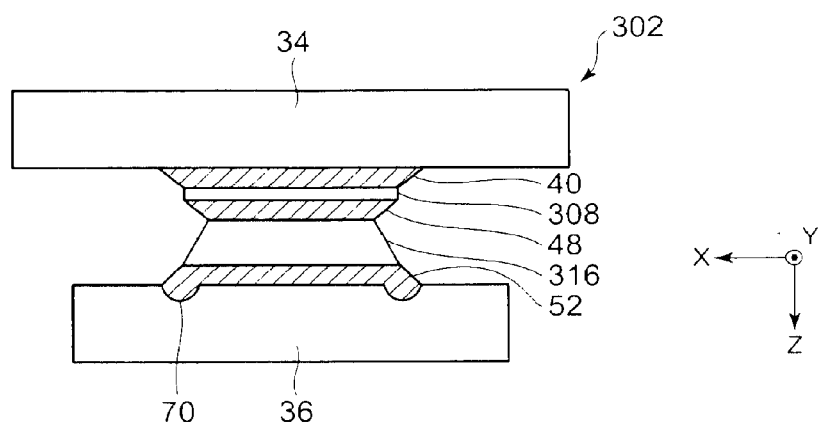
FIG. 16A  FIG. 16B  FIG. 16C
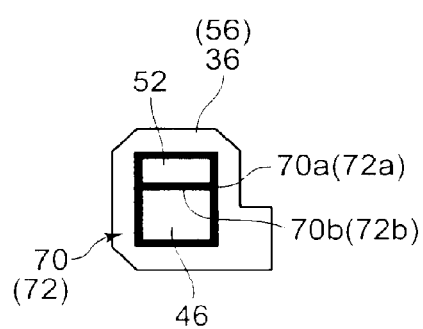 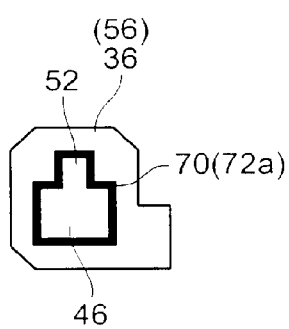 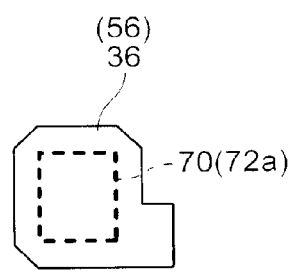

SEMICONDUCTOR DEVICE

RELATED APPLICATIONS

This is a Continuation application of application Ser. No. 14/916,136, filed Mar. 2, 2016, which is a National Stage Application of International Application No. PCT/IB2014/001646 filed Aug. 29, 2014, which claims the benefit of JP 2013-184472 filed Sep. 5, 2013. The disclosures of the prior applications are hereby incorporated by reference herein in its entirety.

TECHNICAL FIELD

The invention relates to a semiconductor device including opposed first and second metal plates, a plurality of semiconductor elements each interposed between the first metal plate and the second metal plate, metal blocks each interposed between the first metal plate and a corresponding one of the semiconductor elements, solder members each interposed between the first metal plate and a corresponding one of the metal blocks and connecting the first metal plate with the corresponding one of the metal blocks, and a resin molding sealing the semiconductor elements and the metal blocks between the first metal plate and the second metal plate, wherein a face of the first metal plate, which is on an opposite side of a face of the first metal plate to which the metal blocks are connected via the solder members, is exposed from the resin molding.

BACKGROUND ART

There is known a semiconductor device including a plurality of semiconductor elements each interposed between two opposed metal plates (see, for example, Japanese Patent No. 4702196). In this semiconductor device, the plurality of semiconductor elements are arranged on the metal plates side by side. These plurality of semiconductor elements are respectively a power transistor (IGBT) that constitutes an arm element of a power converter and a reflux diode connected in parallel with the power transistor, and each are bonded to the metal plates via a corresponding solder member and a corresponding metal block.

For the above-described semiconductor device, there is a metal plate in which grooves are formed on a bonding face, to which the metal blocks are bonded (hereinafter, referred to as grooved metal plate). The grooves allow redundant solder to flow thereinto and prevent spreading of the solder. The grooves each are formed on the bonding face of the grooved metal plate along the outer periphery of a region in which the corresponding solder member is provided, and are formed individually in correspondence with the metal blocks arranged on the metal plate. Each of the grooves for the metal blocks is formed in an annular shape on the bonding face of the grooved metal plate so as to have a size designed for the size of the corresponding metal block.

However, in the above-described semiconductor device, it is required to provide the grooves formed on the metal plate individually in correspondence with the metal blocks, so it is required to provide certain space between the metal blocks such that the grooves of the respective metal blocks do not overlap with each other on the surface of the metal plate. This leads to an increase in size in the direction of the metal plate in which, particularly, the plurality of metal blocks are arranged side by side (that is, the direction in which the plurality of semiconductor elements are arranged side by side), with the result that there is a concern that the size of the semiconductor device itself increases.

SUMMARY OF THE INVENTION

The invention provides a semiconductor device that is able to reduce the size of each of metal plates on which a plurality of semiconductor elements or metal blocks are arranged side by side.

An aspect of the invention provides a semiconductor device. The semiconductor device includes: opposed first and second metal plates; a plurality of semiconductor elements each interposed between the first metal plate and the second metal plate; a metal block interposed between the first metal plate and each of the semiconductor elements; a solder member interposed between the first metal plate and the metal block and connecting the first metal plate to the metal block; and a resin molding sealing the semiconductor elements and the metal block between the first metal plate and the second metal plate. A face of the first metal plate, which is on an opposite side of a face of the first metal plate to which the metal block is connected via the solder member, is exposed from the resin molding. The first metal plate has a groove formed along an outer periphery of a region in which the solder member is provided, the groove collectively surrounding the solder member.

According to the aspect of the invention, it is possible to reduce the size of each of the metal plates on which the plurality of semiconductor elements or the metal blocks are arranged side by side.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8A and FIG. 8B are views for illustrating an advantageous effect of the semiconductor device according to the first embodiment;

FIG. 15 is a cross-sectional view of a relevant portion of a semiconductor device according to an alternative embodiment of the invention;

FIG. 16A to FIG. 16C are views that respectively show bonding faces of metal plates of semiconductor devices according to alternative embodiments of the invention.

DETAILED DESCRIPTION OF EMBODIMENTS

Hereinafter, example embodiments of the semiconductor device according to the invention will be described with reference to the accompanying drawings.

Figure 1:
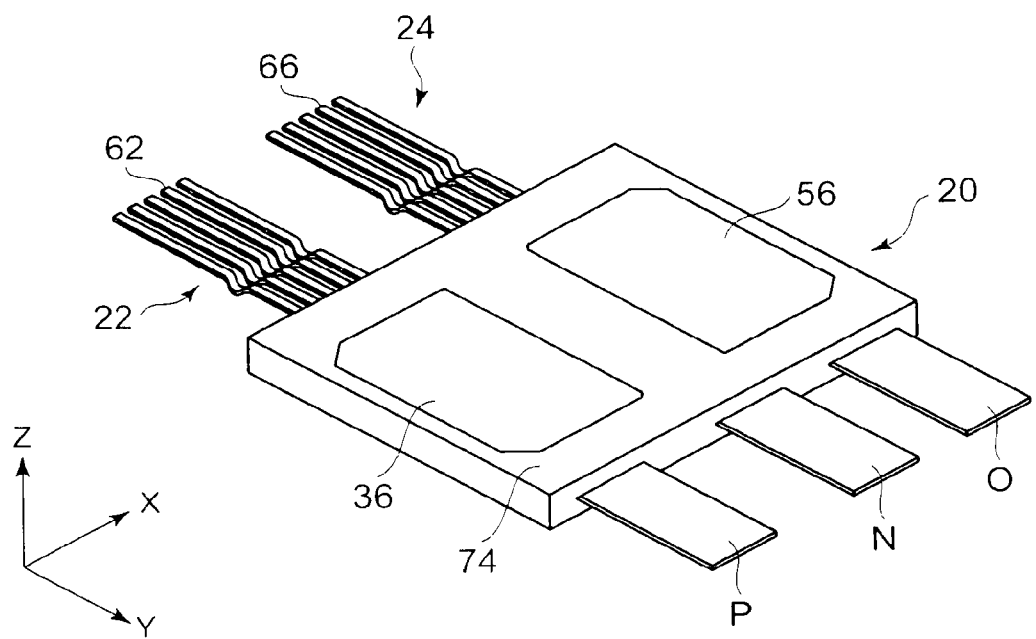
FIG. 1 is an overall perspective view of a semiconductor device according to a first embodiment of the invention.
Figure 2:
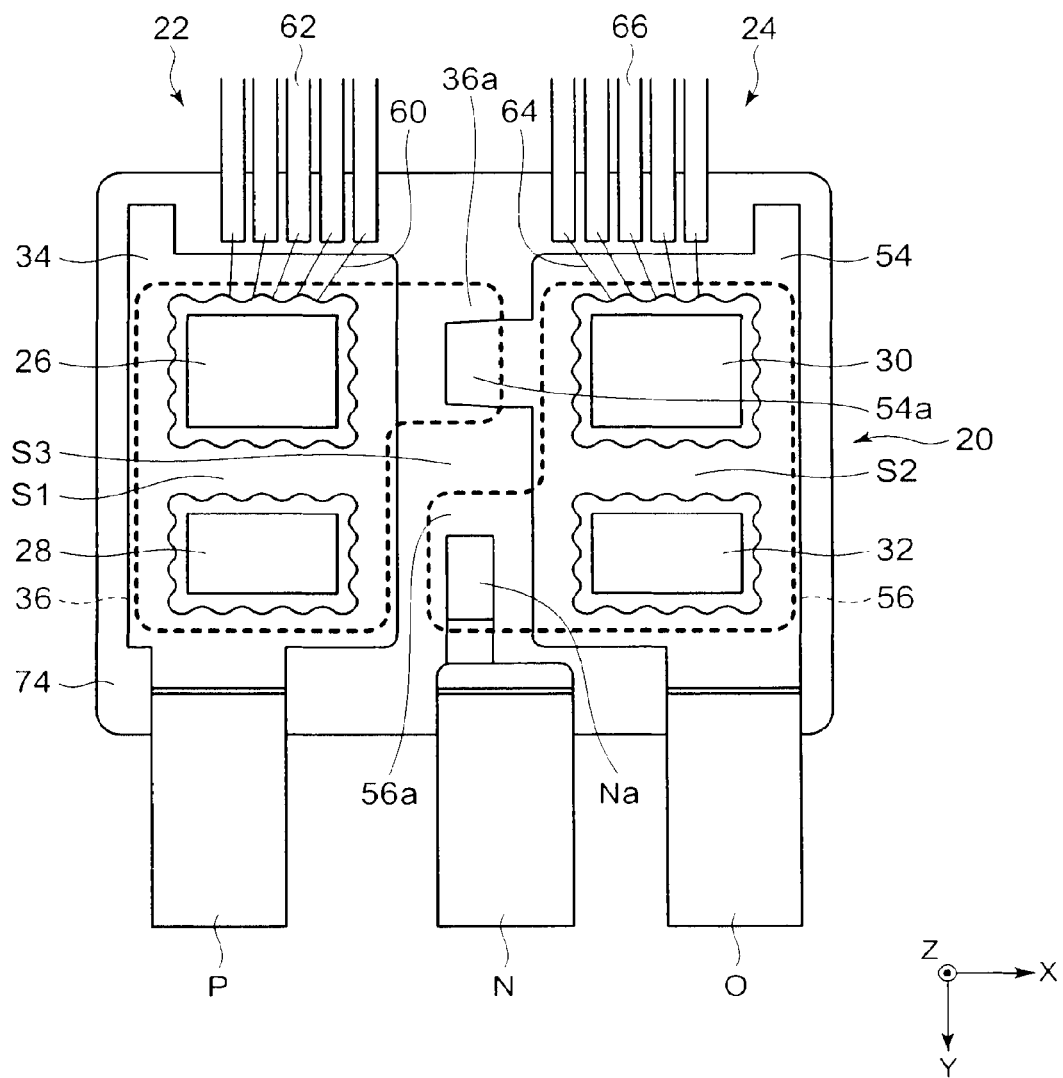
FIG. 2 is a schematic plan view of the semiconductor device shown in FIG. 1.

FIG. 1 shows an overall perspective view of a semiconductor device 20 according to a first embodiment of the invention. FIG. 2 shows a schematic plan view of the semiconductor device 20 shown in FIG. 1.

The semiconductor device 20 according to the present embodiment is a power semiconductor module that is mounted on, for example, a hybrid vehicle, an electric vehicle, or the like, and that is used in a power converter, such as an inverter that converts electric power. The semiconductor device 20 has a molded structure in which arm elements arranged at the upper and lower sides of the power converter are integrated with each other, and has a double-sided cooling structure in which heat of incorporated semiconductor elements is radiated from both top face and bottom face.

The semiconductor device 20 includes an upper arm power unit 22 and a lower arm power unit 24. The upper arm power unit 22 constitutes an upper arm connected to a high-potential power supply. The lower arm power unit 24 constitutes a lower arm connected to a low-potential power supply. The upper arm power unit 22 and the lower arm power unit 24 are arranged side by side in a first direction X. The upper arm power unit 22 includes two different types of semiconductor elements 26, 28. The lower arm power unit 24 includes two different types of semiconductor elements 30, 32. Each of the semiconductor elements 26 to 32 is formed of a semiconductor chip formed in a thin rectangular shape.

Each of the semiconductor elements 26, 30 is a power semiconductor switching element, such as an insulated gate bipolar transistor (IGBT), that undergoes switching operation at the time of converting electric power. Each of the semiconductor elements 28, 32 is a reflux diode that is required in order to circulate current at the time of interrupting a corresponding one of the semiconductor elements 26, 30. Hereinafter, where appropriate, the semiconductor elements 26, 30 are respectively referred to as semiconductor switching elements 26, 30, and the semiconductor elements 28, 32 are respectively referred to as diodes 28, 32.

The upper arm power unit 22 includes the single semiconductor switching element 26 and the single diode 28 as the two semiconductor elements 26, 28. The semiconductor switching element 26 and the diode 28 are connected in parallel with each other. The width of the semiconductor switching element 26, which is a semiconductor chip, in the first direction X is substantially the same as the width of the diode 28, which is a semiconductor chip, in the first direction X.

The lower arm power unit 24 includes the single semiconductor switching element 30 and the single diode 32 as the two semiconductor elements 30, 32. The semiconductor switching element 30 and the diode 32 are connected in parallel with each other. The width of the semiconductor switching element 30, which is a semiconductor chip, in the first direction X is substantially the same as the width of the diode 32, which is a semiconductor chip, in the first direction X.

The semiconductor switching element 26 and the semiconductor switching element 30 are connected in series with each other between the high-potential power supply and the low-potential power supply. The diode 28 and the diode 32 are connected in series with each other between the high-potential power supply and the low-potential power supply.

Each of the semiconductor switching elements 26, 30 has a collector electrode, an emitter electrode and a gate electrode. In each of the semiconductor switching elements 26, 30, the collector electrode is formed on one face of the semiconductor chip, and the emitter electrode and the gate electrode are formed on the other face of the semiconductor chip. In addition, in each of the diodes 28, 32, a cathode electrode is formed on one face of the semiconductor chip, and an anode electrode is formed on the other face of the semiconductor chip.

Figure 3:
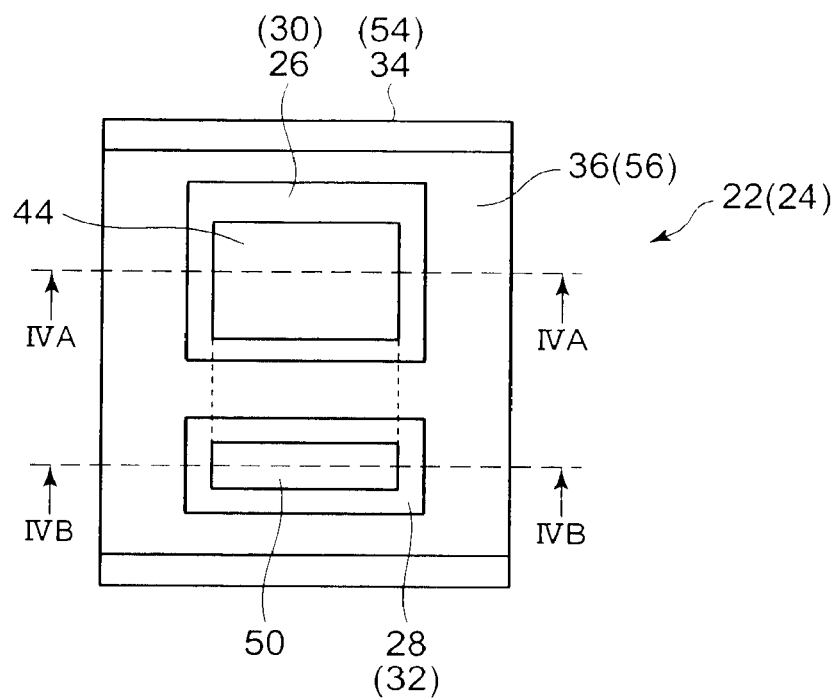
FIG. 3 is a layout plan of the configuration of a relevant portion of the semiconductor device according to the first embodiment.
Figure 4:
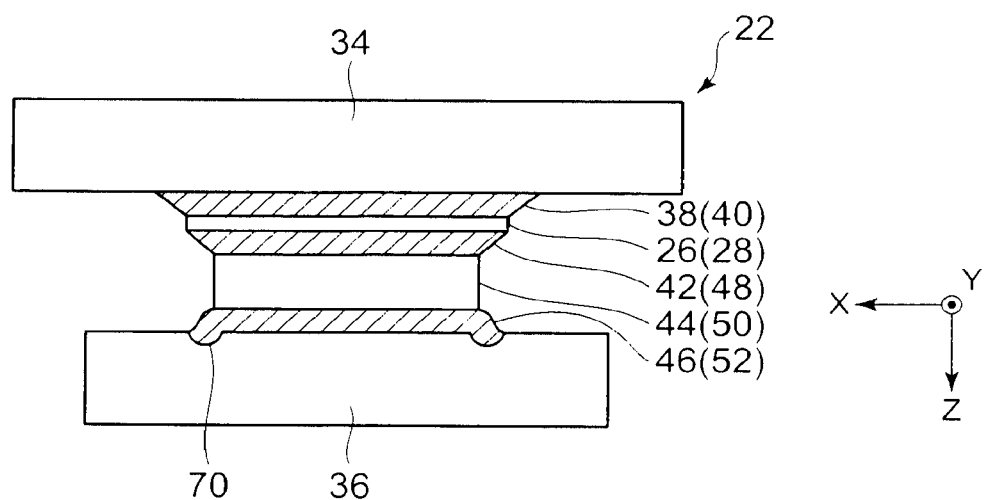
FIG. 4 is a cross-sectional view of the semiconductor device according to the first embodiment, taken along the line IVA-IVA or the line IVB-IVB in FIG. 3.
Figure 5:
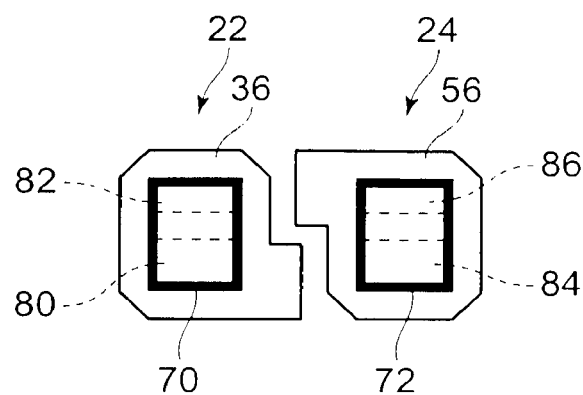
FIG. 5 is a view that shows bonding faces of metal plates of the semiconductor device according to the first embodiment.
Figure 6:
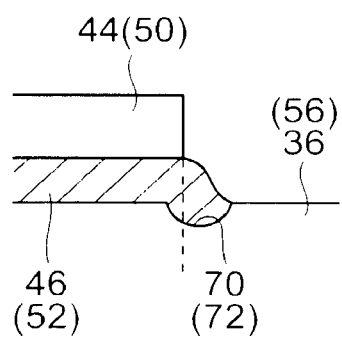
FIG. 6 is an enlarged cross-sectional view of a relevant portion of the semiconductor device according to the first embodiment.

FIG. 3 shows a layout plan of the configuration of a relevant portion of each of the upper arm power unit 22 and the lower arm power unit 24 of the semiconductor device 20 according to the present embodiment. FIG. 4 shows a cross-sectional view of the upper arm power unit 22 according to the present embodiment, taken along the line IVA-IVA or the line IVB-IVB in FIG. 3. In FIG. 4, reference numerals when taken along the line IVB-IVB are shown in parentheses. The lower arm power unit 24 according to the present embodiment also has a similar cross section to the cross section shown in FIG. 4. FIG. 5 is a view that shows a bonding face of a metal plate of the upper arm power unit 22 and a bonding face of a metal plate of the lower arm power unit 24 according to the present embodiment. FIG. 6 shows an enlarged cross-sectional view of a relevant portion of each of the upper arm power unit 22 and the lower arm power unit 24 according to the present embodiment.

The upper arm power unit 22 includes a pair of opposed metal plates 34, 36. Each of the metal plates 34, 36 is a lead frame formed in a planar shape. The metal plates 34, 36 are electric conductors formed of a metal, such as copper, nickel and aluminum. The surfaces of the metal plates 34, 36 may be plated with silver, gold, or the like. The metal plates 34, 36 are respectively provided on both faces of each of the semiconductor switching element 26 and the diode 28. That is, the semiconductor switching element 26 and the diode 28 each are interposed between the pair of metal plates 34, 36, and are sandwiched by both metal plates 34, 36.

The semiconductor switching element 26 and diode 28 of the upper arm power unit 22 are placed on the metal plates 34, 36 (specifically, die pads thereof) side by side with space S1 in an in-plane direction (specifically, second direction Y perpendicular to the first direction X). The metal plates 34, 36 each have an area larger than the sum of the sizes (areas) of the semiconductor elements 26, 28 that are the semiconductor chips.

The size (length) of the space S1 between the semiconductor switching element 26 and the diode 28 on each of the metal plates 34, 36 just needs to be set to a necessary minimum distance in terms of ensuring the heat radiation of each of the semiconductor elements 26, 28. Specifically, the size of the space SL is set so as to be at least larger than the height of each of metal blocks 44, 50 (described later) in a third direction Z. With this structure, heat generated from the semiconductor element 26 or the semiconductor element 28 is easily transferred to the metal plates 34, 36 via the metal blocks 44, 50 and is then easily released from the radiation faces of the metal plates 34, 36 to the outside as compared to the case where the heat is transferred to the other one of the semiconductor elements 28, 26. Therefore, the heat radiation of the semiconductor elements 26, 28 is ensured.

One face of the semiconductor switching element 26 and one face of the diode 28 face the metal plate 34. One face of the semiconductor switching element 26 is bonded to the metal plate 34 via a solder member 38. One face of the diode 28 is bonded to the metal plate 34 via a solder member 40.

The solder members 38, 40 are made of an electrically conductive member, such as tin. The collector electrode of the semiconductor switching element 26 is electrically thermally connected to the metal plate 34 via the solder member 38. The cathode electrode of the diode 28 is electrically thermally connected to the metal plate 34 via the solder member 40. A high-potential connection terminal P connected to the high-potential power supply is connected to the metal plate 34. The voltage of the high-potential power supply is applied to the metal plate 34 via the high-potential connection terminal P. Hereinafter, the metal plate 34 is referred to as high-potential metal plate 34.

On the other hand, the other face of the semiconductor switching element 26 and the other face of the diode 28 face the metal plate 36. The other face of the semiconductor switching element 26 is bonded to the metal plate 36 via a solder member 42, the metal block 44 and a solder member 46. The other face of the diode 28 is bonded to the metal plate 36 via a solder member 48, the metal block 50 and a solder member 52.

The metal block 44 has a size designed for the size of the semiconductor switching element 26, and is formed in substantially a rectangular parallelepiped shape. The metal block 50 has a size designed for the size of the diode 28, and is formed in substantially a rectangular parallelepiped shape. The semiconductor switching element 26 and the diode 28 have substantially the same width in the first direction X, so the metal blocks 44, 50 have substantially the same width in the first direction X.

The solder members 42, 46, 48, 52 are made of an electrically conductive member, such as tin. The metal blocks 44, 50 are made of an electrically conductive metal, such as copper, and have a thickness in a lamination direction (third direction) Z perpendicular to both the first direction X and the second direction Y. The metal blocks 44, 50 have substantially the same height in the third direction Z. The emitter electrode of the semiconductor switching element 26 is electrically thermally connected to the metal plate 36 via the solder members 42, 46 and the metal block 44. The anode electrode of the diode 28 is electrically thermally connected to the metal plate 36 via the solder members 48, 52 and the metal block 50. An output terminal O is connected to the metal plate 36. The output terminal O is connected to a load, or the like, via a metal plate 54 (described later). Hereinafter, the metal plate 36 is referred to as output metal plate 36.

The lower arm power unit 24 has a similar structure to that of the upper arm power unit 22 shown in FIG. 3 and FIG. 4. The lower arm power unit 24 includes a pair of opposed metal plates 54, 56. Each of the metal plates 54, 56 is a lead frame formed in a planar shape. The metal plates 54, 56 are electric conductors formed of a metal, such as copper, nickel and aluminum.

The surfaces of the metal plates 54, 56 may be plated with silver, gold, or the like. The metal plates 54, 56 may be formed of the same metal as the metal plates 34, 36. At least one of the metal plates 54, 56 (for example, only the metal plate 54) may be cut after being formed integrally with the metal plate 34 or the metal plate 36 (for example, only the metal plate 34). The metal plates 54, 56 are respectively provided on both faces of each of the semiconductor switching element 30 and the diode 32. That is, the semiconductor switching element 30 and the diode 32 each are interposed between the pair of metal plates 54 56, and are sandwiched by both metal plates 54, 56.

The semiconductor switching element 30 and diode 32 of the lower arm power unit 24 are placed on the metal plates 54, 56 (specifically, die pads thereof) side by side with space S2 in an in-plane direction (specifically, the second direction Y). The metal plates 54, 56 each have an area larger than the sum of the sizes (areas) of the semiconductor elements 30, 32 that are the semiconductor chips.

The size (length) of the space S2 between the semiconductor switching element 30 and the diode 32 on each of the metal plates 54, 56 is substantially the same as the size of the above-described space S1, and just needs to be set to a necessary minimum distance in terms of ensuring the heat radiation of each of the semiconductor elements 30, 32. With this structure, heat generated from the semiconductor element 30 or the semiconductor element 32 is easily transferred to the metal plates 54, 56 via the metal blocks 44, 50 and is then easily released from the radiation faces of the metal plates 54, 56 to the outside as compared to the case where the heat is transferred to the other one of the semiconductor elements 32, 30. Therefore, the heat radiation of the semiconductor elements 30, 32 is ensured.

Because the lower arm power unit 24 has a similar configuration to that of the upper arm power unit 22, hereinafter, like reference numerals denote the same components of the lower arm power unit 24 as the components of the upper arm power unit 22.

One face of the semiconductor switching element 30 and one face of the diode 32 face the metal plate 54. One face of the semiconductor switching element 30 is bonded to the metal plate 54 via the solder member 38. One face of the diode 32 is bonded to the metal plate 54 via the solder member 40. The collector electrode of the semiconductor switching element 30 is electrically thermally connected to the metal plate 54 via the solder member 38. The cathode electrode of the diode 32 is electrically thermally connected to the metal plate 54 via the solder member 40. The output terminal O is connected to the metal plate 54. The output terminal O is connected to a load, or the like. Hereinafter, the metal plate 54 is referred to as output metal plate 54.

On the other hand, the other face of the semiconductor switching element 30 and the other face of the diode 32 face the metal plate 56. The other face of the semiconductor switching element 30 is bonded to the metal plate 56 via the solder member 42, the metal block 44 and the solder member 46. The other face of the diode 32 is bonded to the metal plate 56 via the solder member 48, the metal block 50 and the solder member 52.

The emitter electrode of the semiconductor switching element 30 is electrically thermally connected to the metal plate 56 via the solder members 42, 46 and the metal block 44. The anode electrode of the diode 32 is electrically thermally connected to the metal plate 56 via the solder members 48, 52 and the metal block 50. A low-potential connection terminal N connected to the low-potential power supply is connected to the metal plate 56. The voltage of the low-potential power supply is applied to the metal plate 56 via the low-potential connection terminal N. Hereinafter, the metal plate 56 is referred to as low-potential metal plate 56.

In the semiconductor device 20, the upper arm power unit 22 and the lower arm power unit 24 are formed such that the high-potential metal plate 34 of the upper arm power unit 22 and the output metal plate 54 of the lower arm power unit 24 face each other via space S3 in the first direction X and the output metal plate 36 of the upper arm power unit 22 and the low-potential metal plate 56 of the lower arm power unit 24 face each other via the space S3 in the first direction X. In this respect, the high-potential metal plate 34 of the upper arm power unit 22 and the output metal plate 54 of the lower arm power unit 24 are located at substantially the same level, and the output metal plate 36 of the upper arm power unit 22 and the low-potential metal plate 56 of the lower arm power unit 24 are located at substantially the same level.

The gate electrode of the semiconductor switching element 26 of the upper arm power unit 22 is connected to one of control terminals 62 via a corresponding one of signal wires 60. The gate electrode of the semiconductor switching element 30 of the lower arm power unit 24 is connected to one of control terminals 66 via a corresponding one of signal wires 64. The signal wires 60, 64 are bonding wires made of, for example, aluminum, copper, or the like.

The high-potential connection terminal P, the low-potential connection terminal N and the output terminal O are provided so as to protrude outward from the end of each of the upper arm power unit 22 and the lower arm power unit 24 in the second direction Y (for example, from the outer end adjacent to the diode 28 of the two types of semiconductor elements 26, 28 arranged side by side in the second direction Y and adjacent to the diode 32 of the two types of semiconductor elements 30, 32 arranged side by side in the second direction Y). The control terminals 62, 66 are provided so as to protrude outward from the end across in the second direction Y from the end at which the high-potential connection terminal P, the low-potential connection terminal N and the output terminal O of the upper arm power unit 22 and lower arm power unit 24 are provided.

An electronic control unit (ECU) mainly formed of a microcomputer is connected to the control terminals 62, 66. A control signal is supplied from the ECU to the gate electrode of the semiconductor switching element 26 via the corresponding control terminal 62 and the corresponding signal wire 60, and a control signal is supplied from the ECU to the to the gate electrode of the semiconductor switching element 30 via the corresponding control terminal 66 and the corresponding signal wire 64. The area (size) of each of the control terminals 62, 66 through which only a small current flows may be smaller than the area (size) of each of the high-potential connection terminal P, the low-potential connection terminal N and the output terminal O through which a large current can flow.

In the upper arm power unit 22, the semiconductor switching element 26 and the diode 28 are sandwiched between the high-potential metal plate 34 and the output metal plate 36 that face each other in the third direction Z. In the lower arm power unit 24, the semiconductor switching element 30 and the diode 32 are sandwiched between the output metal plate 54 and the low-potential metal plate 56 that face each other in the third direction Z. Each of the upper arm power unit 22 and the lower arm power unit 24 has a predetermined thickness in the third direction Z. The thicknesses of the arm power units 22, 24 in the third direction Z are substantially the same.

In the upper arm power unit 22, a groove 70 is provided on the metal plate 36. That is, the metal plate 36 has the groove 70. The groove 70 is provided only on the metal plate 36 different from the metal plate 34 to which the semiconductor elements 26, 28 are directly bonded via the corresponding solder members 38, 40. The semiconductor elements 26, 28 are bonded to the metal plate 36 via the corresponding solder members 42, 48, the corresponding metal blocks 44, 50 and the corresponding solder members 46, 52 (that is, the metal blocks 44, 50 are connected to the metal plate 36 via the corresponding solder members 46, 52). The groove 70 is a groove that prevents spreading of the solder members 46, 52 on a bonding face of the metal plate 36, to which the metal blocks 44, 50 are connected via the corresponding solder members 46, 52 (that is, the solder members 46, 52 are provided).

The groove 70 is formed along the outer peripheries of regions 80, 82 (regions surrounded by the dashed lines in FIG. 5) in which the solder members 46, 52 are provided on the bonding face of the metal plate 36 to which the metal blocks 44, 50 are connected, and is formed in an annular and frame shape so as to collectively surround the solder member 46 corresponding to the semiconductor switching element 26-side metal block 44 and the solder member 52 corresponding to the diode 28-side metal block 50.

That is, the groove 70 is formed to integrally connect a groove provided along the outer periphery of the region 80 in which the solder member 46 corresponding to the semiconductor switching element 26-side metal block 44 is provided with a groove provided along the outer periphery of the region 82 in which the solder member 52 corresponding to the diode 28-side metal block 50 is provided. However, no groove is formed at a boundary portion between the region 80 and the region 82.

Because the metal blocks 44, 50 have substantially the same width in the first direction X, the distance on the metal plate 36 between portions of the groove 70 on both sides of the metal block 44 in the first direction X is substantially the same as the distance on the metal plate 36 between portions of the groove 70 on both sides of the metal block 50 in the first direction X. The width of the region 80 on the metal plate 36 in the first direction X is substantially the same as the width of the region 82 on the metal plate 36 in the first direction X. The solder member 46 is provided in the region 80. The solder member 52 is provided in the region 82. The groove 70 is an annular groove that is formed in substantially a rectangular shape collectively surrounding the solder members 46, 52 on the bonding face of the metal plate 36, and is continuous around the regions 80, 82 of the metal plate 36, in which the solder members 46, 52 are respectively provided. The depth and width of the groove 70 in the metal plate 36 are set to such an extent that a predetermined amount of solder of the solder members 46, 52 is allowed to flow in.

In the lower arm power unit 24, a groove 72 is provided on the metal plate 56. That is, the metal plate 56 has the groove 72. The groove 72 is provided only on the metal plate 56 different from the metal plate 54 to which the semiconductor elements 30, 32 are directly bonded via the corresponding solder members 38, 40. The semiconductor elements 30, 32 are bonded to the metal plate 56 via the corresponding solder members 42, 48, the corresponding metal blocks 44, 50 and the corresponding solder members 46, 52 (that is, the metal blocks 44, 50 are connected to the metal plate 56 via the corresponding solder members 46, 52). The groove 72 is a groove that prevents spreading of the solder members 46, 52 on a bonding face of the metal plate 56, to which the metal blocks 44, 50 are connected via the corresponding solder members 46, 52 (that is, the solder members 46, 52 are provided).

The groove 72 is formed along the outer peripheries of regions 84, 86 (regions surrounded by the dashed lines in FIG. 5) in which the solder members 46 52 are provided on the bonding face of the metal plate 56, to which the metal blocks 44, 50 are connected, and is formed in an annular and frame shape so as to collectively surround the solder member 46 corresponding to the semiconductor switching element 30-side metal block 44 and the solder member 52 corresponding to the diode 32-side metal block 50.

That is, the groove 72 is formed to integrally connect a groove provided along the outer periphery of the region 84 in which the solder member 46 corresponding to the semiconductor switching element 30-side metal block 44 is provided with a groove provided along the outer periphery of the region 86 in which the solder member 52 corresponding to the diode 32-side metal block 50 is provided. However, no groove is formed at a boundary portion between the region 84 and the region 86.

Because the metal blocks 44, 50 have substantially the same width in the first direction X, the distance on the metal plate 56 between portions of the groove 72 on both sides of the metal block 44 in the first direction X is substantially the same as the distance on the metal plate 56 between portions of the groove 72 on both sides of the metal block 50 in the first direction X. The width of the region 84 on the metal plate 56 in the first direction X is substantially the same as the width of the region 86 on the metal plate 56 in the first direction X. The solder member 46 is provided in the region 84. The solder member 52 is provided in the region 86. The groove 72 is an annular groove that is formed in substantially a rectangular shape collectively surrounding the solder members 46, 52 on the bonding face of the metal plate 56, and is continuous around the regions 84, 86 of the metal plate 56, in which the solder members 46, 52 are respectively provided. The depth and width of the groove 72 on the metal plate 56 are set to such an extent that a predetermined amount of solder of the solder members 46, 52 is allowed to flow in.

In the upper arm power unit 22, the semiconductor switching element 26 and the diode 28 are arranged side by side with the space S1 in the second direction Y between the metal plates 34, 36. In the lower arm power unit 24, the semiconductor switching element 30 and the diode 32 are arranged side by side with the space S2 in the second direction Y between the metal plates 54, 56. The upper arm power unit 22 and the lower arm power unit 24 are arranged side by side in the first direction X perpendicular to the second direction Y and the third direction Z.

The upper arm power unit 22 and the lower arm power unit 24 are arranged such that the semiconductor switching elements 26, 30 face each other in the first direction X and the diodes 28, 32 face each other in the first direction X, and are arranged with the space S3 therebetween. The size (length) of the space S3 just needs to be set to, for example, a necessary minimum distance in terms of ensuring the heat radiation of each of the semiconductor elements 26, 28, 30, 32.

The output metal plate 36 of the upper arm power unit 22 has a joint portion 36a that protrudes toward the lower arm power unit 24 at the end in the first direction X. The output metal plate 54 of the lower arm power unit 24 has a joint portion 54a that protrudes toward the upper arm power unit 22 at the end in the first direction X. The output metal plate 36 of the upper arm power unit 22 and the output metal plate 54 of the lower arm power unit 24 are connected to each other such that the joint portions 36a, 54a are in contact with each other.

The low-potential metal plate 56 of the lower arm power unit 24 has a joint portion 56a that protrudes toward the upper arm power unit 22 at the end in the first direction X. The joint portion 56a is provided so as to be offset in the second direction Y from the joint portion 54a of the output metal plate 54 and be offset in the second direction Y from the joint portion 36a of the output metal plate 36 of the upper arm power unit 22 when viewed in the third direction Z. The joint portion 56a of the low-potential metal plate 56 of the lower arm power unit 24 is in contact with and connected to a protruding portion Na extending from the low-potential connection terminal N.

The semiconductor device 20 has a molded structure in which the upper arm power unit 22 and the lower arm power unit 24 arranged side by side in the first direction X are integrally resin-sealed. The semiconductor device 20 includes a resin molding 74 that integrally resin-seals the upper arm power unit 22 and the lower arm power unit 24. The resin molding 74 seals the semiconductor elements 26, 28 and metal blocks 44, 50 of the upper arm power unit 22 between the metal plates 34, 36, and seals the semiconductor elements 30, 32 and metal blocks 44, 50 of the lower arm power unit 24 between the metal plates 54, 56.

The resin molding 74 is made of, for example, epoxy resin, or the like. The above-described resin sealing is carried out by pouring the molten resin molding 74 into a die in which the upper arm power unit 22 and the lower arm power unit 24 are accommodated. Pouring of the molten resin molding 74 into the die is carried out in the second direction Y from substantially near the center in the first direction X at the side of the two power units 22, 24, at which the control terminals 62, 66 are provided (that is, the side at which the signal wires 60, 64 that respectively connect the control terminals 62, 66 with the gate electrodes of the semiconductor switching elements 26, 30 are provided).

Resin sealing by the resin molding 74 is carried out such that part of each of the high-potential connection terminal P, the low-potential connection terminal N, the output terminal O and the control terminals 62, 66 is contained. Therefore, part of each of the high-potential connection terminal P, the low-potential connection terminal N, the output terminal O and the control terminals 62, 66 is exposed so as to protrude outward from the body side (the side surrounded by the resin molding 74) of the semiconductor device 20.

Resin sealing is carried out by using the resin molding 74 such that each of faces (heat radiation faces) of the metal plates 34, 36, 54, 56 on the opposite side of the bonding faces bonded to the metal blocks 44, 50 is exposed to the outside. Therefore, each of the radiation faces of the metal plates 34, 36, 54, 56 on the opposite side of the bonding faces bonded to the metal blocks 44, 50 is exposed to the outside. A heatsink, or the like, is attached in proximity to each of the heat radiation faces of the metal plates 34, 36, 54, 56 on the opposite side of the bonding faces bonded to the metal blocks 44, 50. Therefore, each of the upper arm power unit 22 and the lower arm power unit 24 is cooled from both upper and lower faces. The metal plates 34, 36, 54, 56 function as radiation plates that radiate heat from the upper arm power unit 22 and the lower arm power unit 24.

Figure 7A:
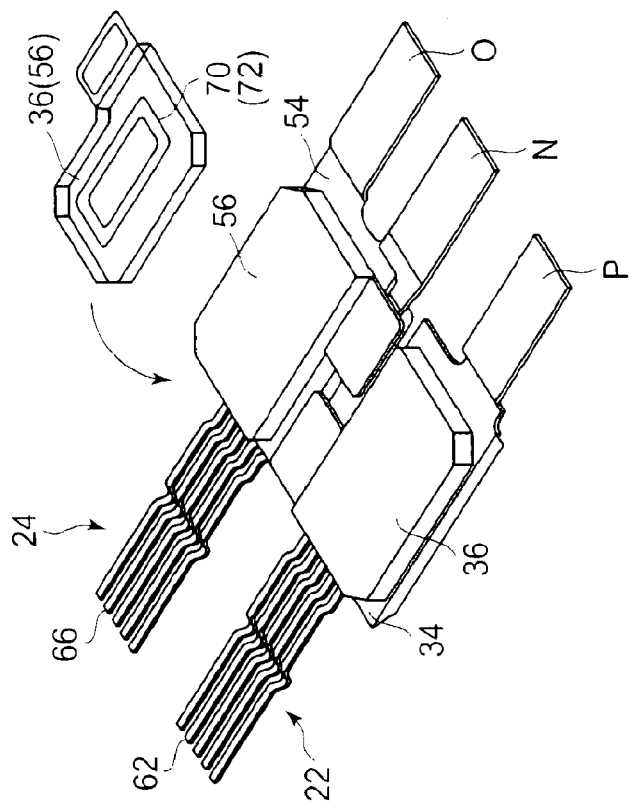
FIG. 7A and FIG. 7B are views that show part of the procedure of assembling the semiconductor device according to the first embodiment.
Figure 7B:
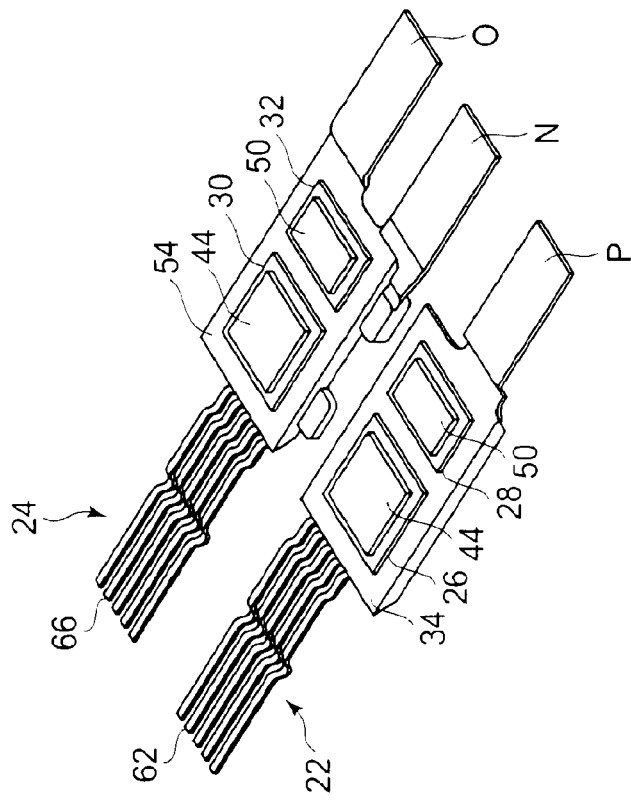

FIG. 7A and FIG. 7B are views that show part of the procedure of assembling the semiconductor device 20 according to the present embodiment. FIG. 7A shows a state before the metal plates 36, 56 are assembled. FIG. 7B shows a state after the metal plates 36, 56 are assembled.

In assembling the semiconductor device 20 according to the present embodiment, initially, as shown in FIG. 7A, the semiconductor elements 26, 28 are mounted on the bonding face of the high-potential metal plate 34 of the upper arm power unit 22 via the solder members 38, 40, and the metal blocks 44, 50 are laminated and mounted on the semiconductor elements 26, 28 via the solder members 42, 48. As shown in FIG. 7A, the semiconductor elements 30, 32 are mounted on the bonding face of the output metal plate 54 of the lower arm power unit 24 via the solder members 38, 40, and the metal blocks 44, 50 are laminated and mounted on the semiconductor elements 30, 32 via the solder members 42, 48.

The high-potential metal plate 34 and the output metal plate 54 may be integrally formed in advance, the semiconductor elements 26, 28, 30, 32 and the metal blocks 44, 50 may be mounted on the high-potential metal plate 34 and the output metal plate 54 and then resin-sealed by the resin molding 74 as will be described later. After completion of the resin sealing, a redundant portion coupling the high-potential metal plate 34 to the output metal plate 54 may be cut to be separated.

The semiconductor switching element 26 and the diode 28 have substantially the same width in the first direction X. At the time of the mounting, the semiconductor switching element 26 and the diode 28 are arranged side by side on the high-potential metal plate 34 in the second direction Y, and the ends of the semiconductor switching element 26 and the diode 28 in the first direction X are aligned with each other. The semiconductor switching element 30 and the diode 32 have substantially the same width in the first direction X. At the time of the mounting, the semiconductor switching element 30 and the diode 32 are arranged side by side on the output metal plate 54 in the second direction Y, and the ends of the semiconductor switching element 30 and the diode 32 in the first direction X are aligned with each other. The metal blocks 44, 50 have substantially the same width in the first direction X as described above. At the time of the mounting, the metal blocks 44, 50 are arranged side by side in the second direction Y, and the ends of the metal blocks 44, 50 in the first direction X are aligned with each other.

That is, the position of the semiconductor switching element 26 in the first direction X and the position of the diode 28 in the first direction X substantially coincide with each other without any offset in the first direction X on the high-potential metal plate 34. The position of the semiconductor switching element 30 in the first direction X and the position of the diode 32 in the first direction X substantially coincide with each other without any offset in the first direction X on the output metal plate 54. The position of the metal block 44 in the first direction X and the position of the metal block 50 in the first direction X substantially coincide with each other without any offset in the first direction X on each of the high-potential metal plate 34 and the output metal plate 54.

When the semiconductor elements 26, 28 and the metal blocks 44, 50 are mounted on the high-potential metal plate 34 as described above, the signal wires 60 are subsequently bonded to the semiconductor switching element 26, and then, as shown in FIG. 7B, the output metal plate 36 is laminated and mounted on the metal blocks 44, 50 via the solder members 46, 52. When the semiconductor elements 30, 32 and the metal blocks 44, 50 have been mounted on the output metal plate 54, the signal wires 64 are subsequently bonded to the semiconductor switching element 30 and then, as shown in FIG. 7B, the low-potential metal plate 56 is laminated and mounted on the metal blocks 44, 50 via the solder members 46, 52.

Mounting of the output metal plate 36 in the upper arm power unit 22 and mounting of the low-potential metal plate 56 in the lower arm power unit 24 are carried out as follows. Solder foils that constitute the solder members 46, 52 are attached to the surfaces of the metal blocks 44, 50, the metal plates 36, 56 are laminated on the metal blocks 44, 50 such that each of the grooves 70, 72 collectively surrounds the corresponding solder members 46, 52, and the solder foils are melted to bond the metal blocks 44, 50 to the metal plates 36, 56.

When the signal wires 60, 64 are bonded and the output metal plate 36 and the low-potential metal plate 56 are mounted as described above, the structure of the upper arm power unit 22 and the structure of the lower arm power unit 24 are subsequently pressed while being accommodated in a die, and then the resin molding 74 is poured into the die. Thus, the upper arm power unit 22 and the lower arm power unit 24 are resin-sealed by the resin molding 74. After the resin sealing, part of the resin molding 74 and part of each of the metal plates 34, 36, 54, 56 are cut. Thus, the heat radiation faces of the metal plates 34, 36, 54, 56 are exposed to the outside.

In the present embodiment, the semiconductor device 20 is manufactured by assembling the following manner. The semiconductor switching element 26 and the diode 28 are sealed between the metal plates 34, 36 of the upper arm power unit 22 by the resin molding 74. The semiconductor switching element 30 and the diode 32 are sealed between the metal plates 54, 56 of the lower arm power unit 24 by the resin molding 74. Then, those upper arm power unit 22 and lower arm power unit 24 are integrated by the resin molding 74.

In the above-described structure of the semiconductor device 20, when the metal blocks 44, 50 are bonded to the metal plates 36, 56 by melting the solder foils attached to the surfaces of the metal blocks 44, 50 into the solder members 46, 52 while being pressed within the die, redundant amounts of solder of the solder members 46, 52 between the metal blocks 44, 50 and the metal plates 36, 56 overflow from the regions therebetween toward the radially outer sides. When redundant amounts of solder of the solder members 46, 52 overflow toward the radially outer sides, the solder of the solder members 46, 52 flows into the grooves 70, 72 formed on the bonding faces of the metal plates 36, 56. The solder of the solder members 46, 52, flowed into the grooves 70, 72 of the metal plates 36, 56, stay in the grooves 70, 72. Therefore, with the grooves 70, 72 formed on the bonding faces of the metal plates 36, 56, it is possible to prevent solder of the solder members 46, 52 from spreading in the in-plane directions of the metal plates 36, 56.

As the height of each of the upper arm power unit 22 and the lower arm power unit 24 in the lamination direction Z is reduced, the amounts of solders of the solder members 46, 52, overflowing from between the metal blocks 44, 50 and the metal plates 36, 56 toward the radially outer sides, increase, so the amounts of solder of the solder members 46, 52, flowing into the grooves 70, 72, increase. In this respect, even when the amounts of solder of the solder members 46, 52 between the metal blocks 44, 50 and the metal plates 36, 56 are determined in advance, it is possible to adjust the height of each of the upper arm power unit 22 and the lower arm power unit 24 in the lamination direction Z by adjusting the amounts of solder of the solder members 46, 52, overflowing from between the metal blocks 44, 50 and the metal plates 36, 56 into the grooves 70, 72.

Thus, with the grooves 70, 72 of the metal plates 36, 56, it is possible to absorb tolerance variations in the height of each of the upper arm power unit 22 and the lower arm power unit 24 in the lamination direction Z. It is difficult to provide the semiconductor elements 26 to 32 with grooves that allow redundant solder for absorbing tolerance variations to flow thereinto because there may occur an inconvenience that, for example, the solder members 42, 48 adhere to the surfaces of the semiconductor elements 26 to 32 due to wraparound of solder of the solder members 42, 48.

FIG. 8A and FIG. 8B are views for illustrating the advantageous effect of the semiconductor device 20 according to the present embodiment. FIG. 8A is a view that shows a bonding face of a metal plate 102 of a semiconductor device 100 according to a comparative embodiment, which is compared with the semiconductor device 20 according to the present embodiment. FIG. 8B is a view that shows the bonding face of each of the metal plates 36, 56 of the semiconductor device 20 according to the present embodiment.

In the structure of the semiconductor device 20 according to the present embodiment, the groove 70 formed on the bonding face of the metal plate 36 is formed on the bonding face along the outer peripheries of the regions 80, 82 in which the solder members 46, 52 are provided so as to collectively surround the semiconductor switching element 26-side solder member 46 and the diode 28-side solder member 52, and the groove 72 formed on the bonding face of the metal plate 56 is formed on the bonding face along the outer peripheries of the regions 84, 86 in which the solder members 46, 52 are provided so as to collectively surround the semiconductor switching element 30-side solder member 46 and the diode 32-side solder member 52 (see FIG. 8B). The groove 70 of the upper arm power unit 22 prevents spreading of both the semiconductor switching element 26-side solder member 46 and the diode 28-side solder member 52. The groove 72 of the lower arm power unit 24 prevents spreading of both the semiconductor switching element 30-side solder member 46 and the diode 32-side solder member 52.

With the above structure, different from the structure of the semiconductor device 100 according to the comparative embodiment shown in FIG. 8A, in which grooves 104, 106 for preventing spreading of the solder members 46, 52 individually for the metal blocks 44, 50 corresponding to the semiconductor switching element 26 and the diode 28 or the semiconductor switching element 30 and the diode 32 are formed on the metal plate 102, a groove corresponding to the solder member 46 and a groove corresponding to the solder member 52 do not need to be provided separately between the region in which the semiconductor switching element 26-side solder member 46 is provided and the region in which the diode 28-side solder member 52 is provided on the bonding face of the metal plate 36 or between the region in which the semiconductor switching element 30-side solder member 46 is provided and the region in which the diode 32-side solder member 52 is provided on the bonding face of the metal plate 56.

In this respect, in the semiconductor device 20, it is not required to consider the widths of both the grooves 104, 106 unlike the semiconductor device 100 according to the comparative embodiment at the time of determining the size of the space S1 between the semiconductor switching element 26 and the diode 28 that are placed side by side in the second direction Y on the metal plates 34, 36 of the upper arm power unit 22, and it is sufficient that the size of the space S1 is set to a necessary minimum distance for ensuring the heat radiation of each of the semiconductor elements 26, 28. This also applies to the size of the space S2 between the semiconductor switching element 30 and diode 32 of the lower arm power unit 24.

Therefore, with the semiconductor device 20 according to the present embodiment, in comparison with the semiconductor device 100 according to the comparative embodiment, it is possible to reduce the width of each of the metal plates 34, 36 in the second direction Y, on which the two types of semiconductor elements 26, 28 of the upper arm power unit 22 are arranged side by side in the second direction Y, and the width of each of the metal plates 54, 56 in the second direction Y, on which the two types of semiconductor elements 30, 32 of the lower arm power unit 24 are arranged side by side in the second direction Y. In this respect, it is possible to reduce the size and weight of each of the metal plates 34, 36, 54, 56, with the result that it is possible to reduce the size and weight of the semiconductor device 20 itself.

In the structure of the semiconductor device 20 according to the present embodiment, the width of the semiconductor switching element 26 of the upper arm power unit 22 in the first direction X is substantially the same as the width of the diode 28 of the upper arm power unit 22 in the first direction X. The width of the semiconductor switching element 30 of the lower arm power unit 24 in the first direction X is substantially the same as the width of the diode 32 of the lower arm power unit 24 in the first direction X. In the above structure, the reel width of the solder foil that is used as the solder member 38 that bonds the metal plate 34 to the semiconductor switching element 26 in the upper arm power unit 22 is substantially the same as the reel width of the solder foil that is used as the solder member 40 that bonds the metal plate 34 to the diode 28. Similarly, the reel width of the solder foil that is used as the solder member 38 that bonds the metal plate 54 to the semiconductor switching element 30 in the lower arm power unit 24 is substantially the same as the reel width of the solder foil that is used as the solder member 40 that bonds the metal plate 54 to the diode 32.

In this respect, in the semiconductor device 20, it is possible to use the same material for the solder foils that are attached as the solder members 38 respectively interposed between the semiconductor switching elements 26, 30 and the metal plates 34, 54 and for the solder foils that are attached as the solder members 40 respectively interposed between the diodes 28, 32 and the metal plates 34, 54. Therefore, it is possible to reduce the number of types of solder foil that is used in the semiconductor device 20.

In addition, in any one of the upper arm power unit 22 and the lower arm power unit 24, the widths of the metal blocks 44, 50 in the first direction X are substantially the same. In the above structure, the reel width of the solder foil that is used as the solder member 42 that bonds the semiconductor switching element 26 to the metal block 44 in the upper arm power unit 22 is substantially the same as the reel width of the solder foil that is used as the solder member 48 that bonds the diode 28 to the metal block 50. The reel width of the solder foil that is used as the solder member 46 that bonds the metal block 44 to the metal plate 36 in the upper arm power unit 22 is substantially the same as the reel width of the solder foil that is used as the solder member 52 that bonds the metal block 50 to the metal plate 36.

Similarly, in the lower arm power unit 24, the reel width of the solder foil that is used as the solder member 42 that bonds the semiconductor switching element 30 to the metal block 44 is substantially the same as the reel width of the solder foil that is used as the solder member 48 that bonds the diode 32 to the metal block 50, and the reel width of the solder foil that is used as the solder member 46 that bonds the metal block 44 to the metal plate 56 is substantially the same as the reel width of the solder foil that is used as the solder member 52 that bonds the metal block 50 to the metal plate 56.

In this respect, in the semiconductor device 20, it is possible to use the same material for the solder foils that are attached as the solder members 42 respectively interposed between the semiconductor switching elements 26, 30 and the metal blocks 44 and for the solder foils that are attached as the solder members 48 respectively interposed between the diodes 28, 32 and the metal blocks 50. Therefore, it is possible to reduce the number of types of solder foil that is used in the semiconductor device 20. It is possible to use the same material for the solder foils that are attached as the solder members 46 respectively interposed between the metal blocks 44 and the metal plates 36, 56 and for the solder foils that are attached as the solder members 52 respectively interposed between the metal blocks 50 and the metal plates 36, 56. Therefore, it is possible to reduce the number of types of solder foil that is used in the semiconductor device 20.

The semiconductor device 20 according to the present embodiment has an integrated molded structure in which the upper arm power unit 22 and the lower arm power unit 24 are mounted side by side in the first direction X. The groove 70 provided on the metal plate 36 of the upper arm power unit 22 is formed in substantially a rectangular shape so as to collectively surround the solder member 46 corresponding to the semiconductor switching element 26-side metal block 44 and the solder member 52 corresponding to the diode 28-side metal block 50. The groove 72 provided on the metal plate 56 of the lower arm power unit 24 is formed in substantially a rectangular shape so as to collectively surround the solder member 46 corresponding to the semiconductor switching element 30-side metal block 44 and the solder member 52 corresponding to the diode 32-side metal block 50.

In the above structure, different from the structure of the semiconductor device 100 according to the comparative embodiment shown in FIG. 8A, in which grooves 104, 106 are formed on the metal plate 102 individually in correspondence with the metal blocks 44, 50 corresponding to the semiconductor switching element 26 and the diode 28 or the semiconductor switching element 30 and the diode 32, the arrangement positional relationship between the solder member 46 corresponding to the semiconductor switching element 26-side metal block 44 and the solder member 52 corresponding to the diode 28-side metal block 50, which are arranged side by side in the second direction Y within the frame surrounded by the groove 70 of the metal plate 36 or the arrangement positional relationship between the solder member 46 corresponding to the semiconductor switching element 30-side metal block 44 and the solder member 52 corresponding to the diode 32-side metal block 50, which are arranged side by side in the second direction Y within the frame surrounded by the groove 72 of the metal plate 56, is allowed to be inverted within the frame surrounded by the corresponding one of the grooves 70, 72.

That is, the semiconductor switching element 26 and the solder member 46 may be arranged on the metal plate 36 at the side in the second direction Y, at which the joint portion 36a is provided, and the diode 28 and the solder member 52 may be arranged at the side in the second direction Y, at which the joint portion 36a is not provided, or the semiconductor switching element 30 and the solder member 46 may be arranged on the metal plate 56 at the side in the second direction Y, at which the joint portion 56a is provided, and the diode 32 and the solder member 52 may be arranged at the side in the second direction Y, at which the joint portion 56a is not provided. Alternatively, the diode 28 and the solder member 52 may be arranged on the metal plate 36 at the side in the second direction Y, at which the joint portion 36a is provided and the semiconductor switching element 26 and the solder member 46 may be arranged at the side in the second direction Y, at which the joint portion 36a is not provided, or the diode 32 and the solder member 52 may be arranged on the metal plate 56 at the side in the second direction Y, at which the joint portion 56a is provided and the semiconductor switching element 30 and the solder member 46 may be arranged at the side in the second direction Y, at which the joint portion 56a is not provided.

In this respect, in the semiconductor device 100 according to the comparative embodiment, the orientation in which the two grooves 104, 106 are arranged on the metal plate 102 that is used for the upper arm power unit 22 in which the two types of semiconductor elements 26, 28 are arranged is inverted in the second direction Y from the orientation in which the two grooves 104, 106 are arranged on the metal plate 102 that is used for the lower arm power unit 24 in which the two types of semiconductor elements 30, 32 are mounted. Therefore, it is difficult to use the same member for the upper arm power unit 22-side metal plate 102 and the lower arm power unit 24-side metal plate 102.

In contrast to this, in the semiconductor device 20 according to the present embodiment, it is possible to commonalize the metal plate 36 that is used for the upper arm power unit 22 and the metal plate 56 that is used for the lower arm power unit 24, and it is possible to constitute both the upper arm power unit 22 and the lower arm power unit 24 by changing the order of arrangement of the semiconductor switching element 26 and the diode 28 and the order of arrangement of the semiconductor switching element 30 and the diode 32 in the second direction Y on the metal plates 36, 56 having the same shape. Therefore, it is possible to reduce the types of components (specifically the metal plates 36, 56) that are used in the semiconductor device 20 into one-type component.

Figure 9A:
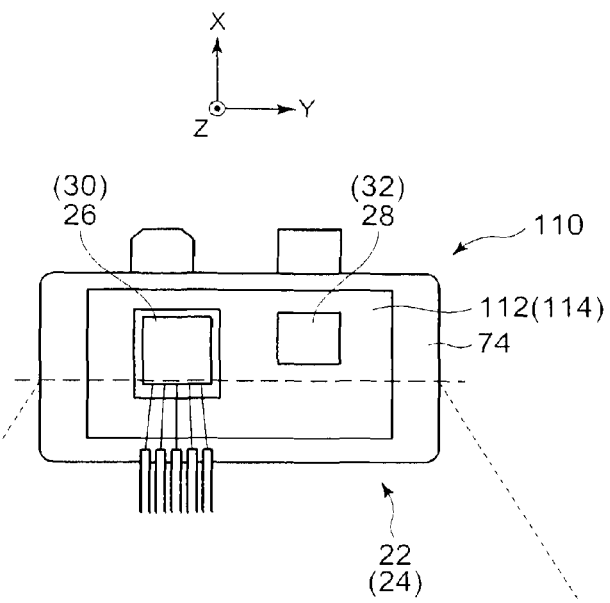
FIG. 9A to FIG. 9C are views for illustrating the characteristic of a semiconductor device according to a comparative embodiment, which is compared with the semiconductor device according to the first embodiment.
Figure 9B:
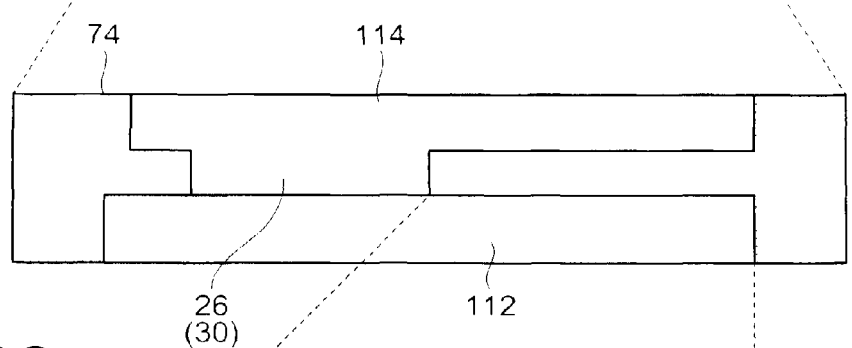
Figure 9C:
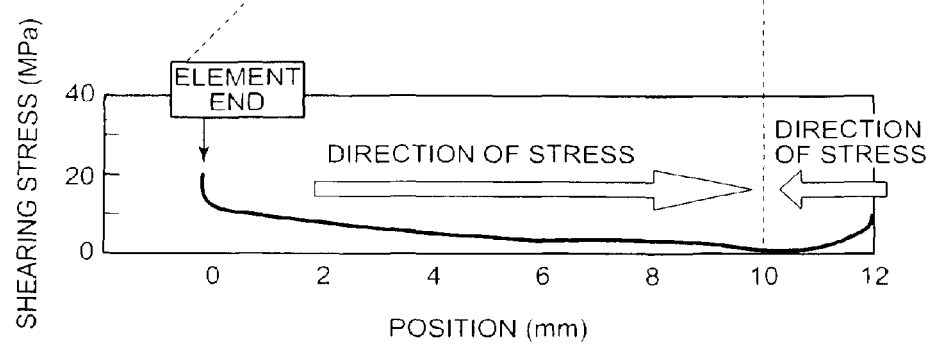
Figure 10A:
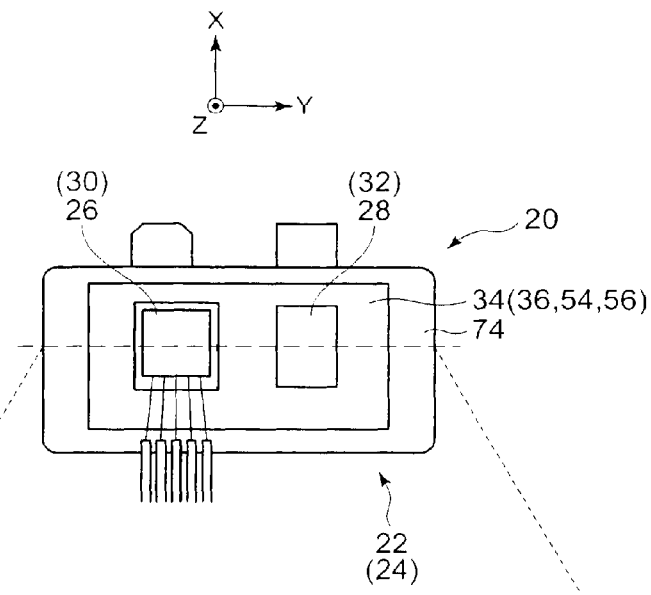
FIG. 10A to FIG. 10C are views for illustrating the characteristic of the semiconductor device according to the first embodiment.
Figure 10B:
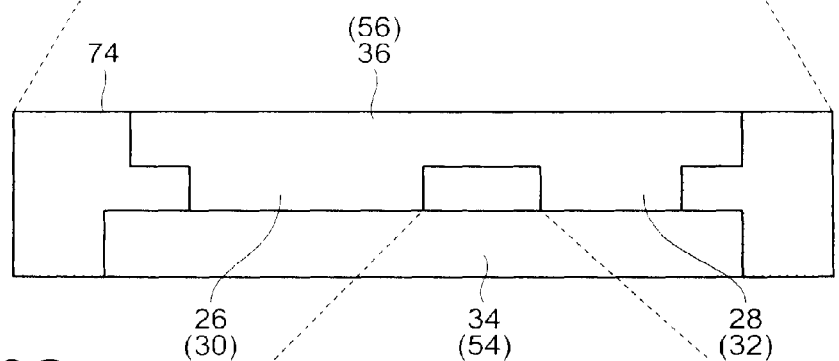
Figure 10C:
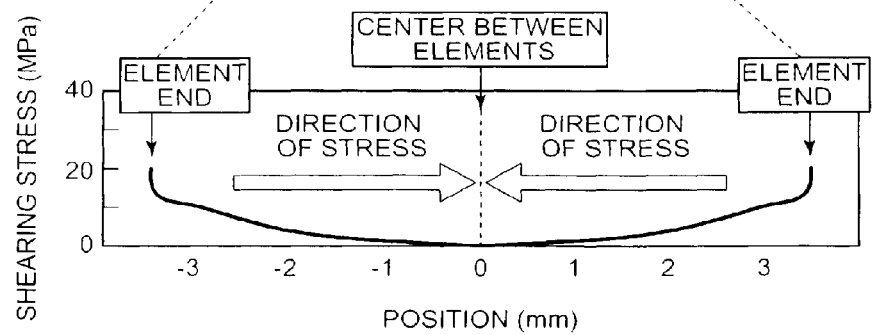

FIG. 9A to FIG. 9C are views for illustrating the characteristic of a semiconductor device 110 according to a comparative embodiment, which is compared with the semiconductor device 20 according to the present embodiment. FIG. 10A to FIG. 10C are views for illustrating the characteristic of the semiconductor device 20 according to the present embodiment. FIG. 9A shows the layout of the semiconductor elements on the metal plate in the semiconductor device. FIG. 10A shows the layout of the semiconductor elements on the metal plate in the semiconductor device. FIG. 9B shows the cross-sectional view of the semiconductor device shown in FIG. 9A. FIG. 10B shows the cross-sectional view of the semiconductor device shown in FIG. 10A. FIG. 9C is a view that shows a shearing stress based on a location on the cross section shown in FIG. 9B in the semiconductor device. FIG. 10C is a view that shows a shearing stress based on a location on the cross section shown in FIG. 10B in the semiconductor device.

In the structure of the semiconductor device 20 according to the present embodiment, the semiconductor switching element 26 and diode 28 of the upper arm power unit 22 have substantially the same width in the first direction X, and are arranged on the metal plates 34, 36 side by side in the second direction Y such that the ends in the first direction X are aligned with each other. The semiconductor switching element 30 and diode 32 of the lower arm power unit 24 have substantially the same width in the first direction X, and are arranged on the metal plates 54, 56 side by side in the second direction Y such that the ends in the first direction X are aligned with each other.

In the semiconductor device 110 according to the comparative embodiment in which the width of each of the semiconductor switching elements 26, 30 in the first direction X is different from the width of a corresponding one of the diodes 28, 32 in the first direction X as shown in FIG. 9A. The semiconductor switching element 26 and the diode 28 or the semiconductor switching element 30 and the diode 32 are arranged on the pair of metal plates 112, 114 side by side in the second direction Y, while the ends in the first direction X are not aligned with each other. With the above structure, depending on a position in the semiconductor device 110 in the first direction X, the semiconductor switching element 26 and the diode 28 or the semiconductor switching element 30 and the diode 32, arranged side by side in the second direction Y, face each other in the second direction Y or the semiconductor switching element 26 and the diode 28 or the semiconductor switching element 30 and the diode 32 do not face each other.

At the portion at which the semiconductor switching element 26 and the diode 28 or the semiconductor switching element 30 and the diode 32 do not face each other in the second direction Y, as compared to the facing portion, the point at which the orientation of shearing stress changes at the contact face between the resin molding 74 and the metal plate 112 or the metal plate 114 is farther from the end of the semiconductor switching element 26 or the semiconductor switching element 30 in the second direction Y (see FIG. 9B and FIG. 9C). Therefore, in the semiconductor device 110 according to the comparative embodiment, a distance of progress at the time of peeling of the resin molding 74 from the metal plate 112 or the metal plate 114 extends, so the peeling becomes easy to progress.

In contrast, in the structure of the semiconductor device 20 according to the present embodiment, there is no portion at which the semiconductor switching element 26 and the diode 28 or the semiconductor switching element 30 and the diode 32 do not face each other in the second direction Y, so the semiconductor switching element 26 and the diode 28 or the semiconductor switching element 30 and the diode 32 face each other in the second direction Y. With the above configuration, the point at which the direction of shearing stress changes at the contact face between the resin molding 74 and each of the metal plate 34, 36, 54, 56 is substantially the center between the end of a corresponding one of the semiconductor switching elements 26, 30 in the second direction Y and the end of a corresponding one of the diodes 28, 32 in the second direction Y. In this case, the shearing stress at the space S1 in the second direction Y between the semiconductor switching element 26 and the diode 28 or the shearing stress at the space S2 in the second direction Y between the semiconductor switching element 30 and the diode 32 is balanced in the second direction Y with respect to substantially the center of the space S1 or the space S2.

Therefore, with the semiconductor device 20 according to the present embodiment, as compared to the semiconductor device 110 according to the comparative embodiment, a distance of progress at the time of peeling of the resin molding 74 from each of the metal plates 34, 36, 54, 56 reduces, so it is possible to reduce shearing stress at the contact faces at which the resin molding 74 is in contact with the metal plates 34, 36, 54, 56, and it is possible to suppress the progress of the peeling.

In the above-described first embodiment, the semiconductor switching elements 26, 30 and the diodes 28, 32 may be regarded as "semiconductor elements" according to the aspect of the invention, one of the pair of metal plates 34, 36 of the upper arm power unit 22 and one of the pair of metal plates 54, 56 of the lower arm power unit 24 may be regarded as "first metal plates" according to the aspect of the invention, the other one of the metal plates 34, 36 of the upper arm power unit 22 and the other one of the metal plates 54, 56 of the lower arm power unit 24 may be regarded as "second metal plates" according to the aspect of the invention, the regions 80, 82, 84, 86 may be regarded as "regions" according to the aspect of the invention, the second direction Y may be regarded as "predetermined direction" according to the aspect of the invention and the first direction X may be regarded as "perpendicular direction" according to the aspect of the invention.

Figure 11:
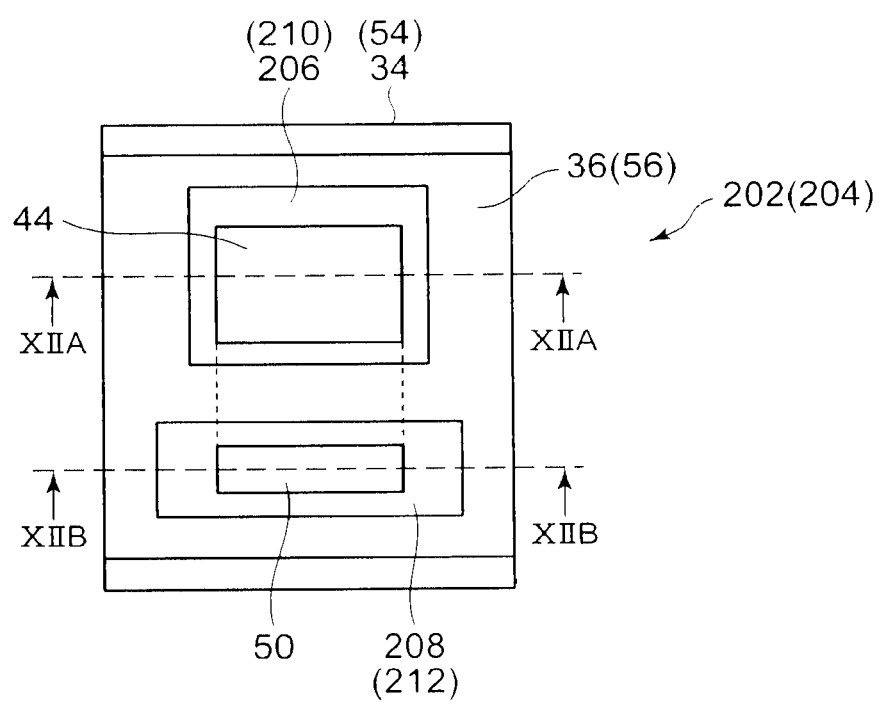
FIG. 11 is a layout plan of the configuration of a relevant portion of a semiconductor device according to a second embodiment of the invention.
Figure 12A:
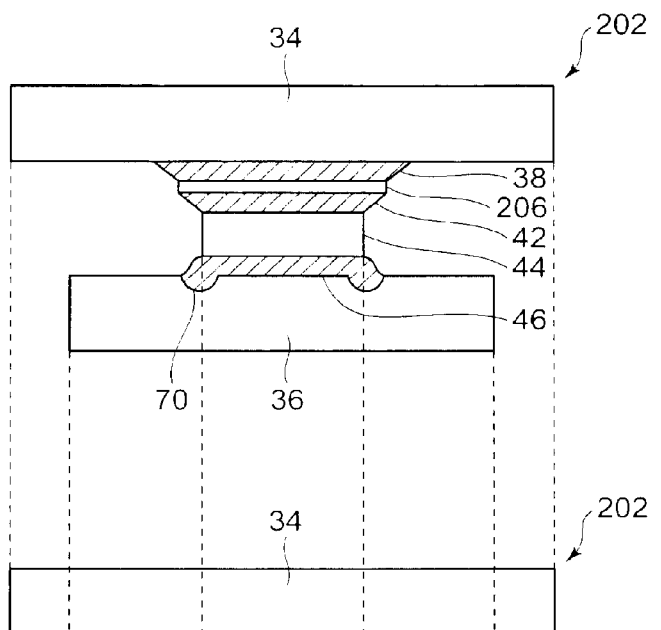
FIG. 12A and FIG. 12B are cross-sectional views of the semiconductor device according to the second embodiment, respectively taken along the line XIIA-XIIA and the line XIIB-XIIB in FIG. 11.
Figure 12A:
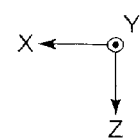
Figure 12B:
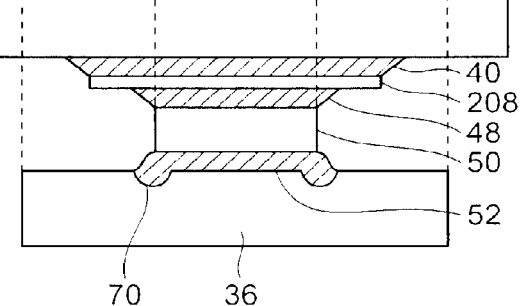
Figure 12B:
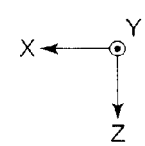

FIG. 11 is a layout plan of the configuration of a relevant portion of each of an upper arm power unit 202 and a lower arm power unit 204 of a semiconductor device 200 according to a second embodiment of the invention. FIG. 12A and FIG. 12B are cross-sectional views of the upper arm power unit 202 according to the present embodiment, taken along the line XIIA-XIIA and the line XIIB-XIIB in FIG. 11. FIG. 12A shows the cross-sectional view taken along the line XIIA-XIIA. FIG. 12B shows the cross-sectional view taken along the line XIIB-XIIB. In FIG. 11, FIG. 12A and FIG. 12B, like reference numerals denote the same components as those used in the above-described first embodiment, and the description thereof is omitted or simplified.

The semiconductor device 200 according to the present embodiment includes the upper arm power unit 202 and the lower arm power unit 204. The upper arm power unit 202 constitutes an upper arm that is connected to the high-potential power supply. The lower arm power unit 204 constitutes a lower arm that is connected to the low-potential power supply. The upper arm power unit 202 includes two different types of semiconductor elements 206, 208. The lower arm power unit 204 includes two different types of semiconductor elements 210, 212.

The semiconductor elements 206, 208, 210, 212 each are formed of a semiconductor chip formed in a thin rectangular shape, and respectively have the same configurations and functions as the semiconductor elements 26, 28, 30, 32 according to the above-described first embodiment except the widths thereof. The upper arm power unit 202 and the lower arm power unit 204 respectively have the same configurations and functions as the upper arm power unit 22 and the lower arm power unit 24 according to the first embodiment except the widths of the semiconductor elements 206, 208, 210, 212, the sizes of solder members associated with the widths, and the like.

The width of the semiconductor switching element 206 in the first direction X is different from the width of the diode 208 in the first direction X. The width of the semiconductor switching element 210 in the first direction X is different from the width of the diode 212 in the first direction X. Specifically, the width of the diode 208 in the first direction X is larger than the width of the semiconductor switching element 206 in the first direction X, and the width of the diode 212 in the first direction X is larger than the width of the semiconductor switching element 210 in the first direction X. On the other hand, in each of the upper arm power unit 202 and the lower arm power unit 204, the metal blocks 44, 50 are formed in substantially a rectangular parallelepiped shape, and the metal blocks 44, 50 have substantially the same width in the first direction X.

In the upper arm power unit 202, the semiconductor switching element 206 and the diode 208 are arranged side by side in the second direction Y on the metal plates 34, 36, and the metal blocks 44, 50 are respectively laminated on the semiconductor elements 206, 208. The metal block 44 is laminated on the semiconductor switching element 206 such that the metal block 44 is located at substantially the center in the first direction X with respect to the semiconductor element 206. The metal block 50 is laminated on the diode 208 such that the metal block 50 is located at substantially the center in the first direction X with respect to the semiconductor element 208. These metal blocks 44, 50 are arranged side by side in the second direction Y on the metal plates 34, 36 such that the ends in the first direction X are aligned with each other without any offset in the first direction X.

In the lower arm power unit 204, the semiconductor switching element 210 and the diode 212 are arranged side by side in the second direction Y on the metal plates 54, 56, and the metal blocks 44, 50 are respectively laminated on the semiconductor elements 210, 212. The metal block 44 is laminated on the semiconductor switching element 210 such that the metal block 44 is located at substantially the center in the first direction X with respect to the semiconductor element 210. The metal block 50 is laminated on the diode 212 such that the metal block 50 is located at substantially the center in the first direction X with respect to the semiconductor element 212. These metal blocks 44, 50 are arranged side by side in the second direction Y on the metal plates 54, 56 such that the ends in the first direction X are aligned without any offset in the first direction X.

The groove 70 formed on the bonding face of the metal plate 36 is formed on the bonding face along the outer peripheries of the regions 80, 82 in which the solder members 46, 52 are provided, and is formed in an annular and frame shape so as to collectively surround the solder member 46 corresponding to the semiconductor switching element 206-side metal block 44 and the solder member 52 corresponding to the diode 208-side metal block 50. The groove 72 formed on the bonding face of the metal plate 56 is formed on the bonding face along the outer peripheries of the regions 84, 86 in which the solder members 46, 52 are provided, and is formed in an annular and frame shape so as to collectively surround the solder member 46 corresponding to the semiconductor switching element 210-metal block 44 and the solder member 52 corresponding to the diode 212-side metal block 50.

The distance between portions of the groove 70 on both sides of the metal block 44 in the first direction X on the metal plate 36 is substantially the same as the distance between portions of the groove 70 on both sides of the metal block 50 in the first direction X on the metal plate 36. The width of the region 80 on the metal plate 36 in the first direction X is substantially the same as the width of the region 82 on the metal plate 36 in the first direction X. The solder member 46 is provided in the region 80. The solder member 52 is provided in the region 82. The groove 70 is an annular groove that is formed in substantially a rectangular shape collectively surrounding the solder members 46, 52 on the bonding face of the metal plate 36, and is continuous around the regions 80, 82 of the metal plate 36, in which the solder members 46, 52 are respectively provided.

The distance between portions of the groove 72 on both sides of the metal block 44 in the first direction X on the metal plate 56 is substantially the same as the distance between portions of the groove 72 on both sides of the metal block 50 in the first direction X on the metal plate 56. The width of the region 84 on the metal plate 56 in the first direction X is substantially the same as the width of the region 86 on the metal plate 56 in the first direction X. The solder member 46 is provided in the region 84. The solder member 52 is provided in the region 86. The groove 72 is an annular groove that is formed in substantially a rectangular shape collectively surrounding the solder members 46, 52 on the bonding face of the metal plate 56, and is continuous around the regions 84, 86 of the metal plate 56, in which the solder members 46, 52 are respectively provided.

In the structure of the semiconductor device 200 according to the present embodiment, the groove 70 of the upper arm power unit 202 prevents spreading of both the semiconductor switching element 206-side solder member 46 and the diode 208-side solder member 52. The groove 72 of the lower arm power unit 204 prevents spreading of both the semiconductor switching element 210-side solder member 46 and the diode 212-side solder member 52. With the above configuration as well, a groove corresponding to the solder member 46 and a groove corresponding to the solder member 52 do not need to be provided individually for the region in which the semiconductor switching element 206-side solder member 46 is provided and the region in which the diode 208-side solder member 52 is provided on the bonding face of the metal plate 36 or for the region in which the semiconductor switching element 210-side solder member 46 is provided and the region in which the diode 212-side solder member 52 is provided on the bonding face of the metal plate 56.

Therefore, with the semiconductor device 200 according to the present embodiment as well, it is possible to reduce the width of each of the metal plates 34, 36 in the second direction Y, on which the two types of semiconductor elements 206, 208 of the upper arm power unit 202 are arranged side by side in the second direction Y, and the width of each of the metal plates 54, 56 in the second direction Y, on which the two types of semiconductor elements 210, 212 of the lower arm power unit 204 are arranged side by side in the second direction Y. Therefore, it is possible to reduce the size and weight of each of the metal plates 34, 36, 54, 56, and, by extension, it is possible to reduce the size and weight of the semiconductor device 200 itself.

In the structure of the semiconductor device 200, the reel width of the solder foil that is used as the solder member 42 that bonds the semiconductor switching element 206 to the metal block 44 in the upper arm power unit 202 is substantially the same as the reel width of the solder foil that is used as the solder member 48 that bonds the diode 208 to the metal block 50. The reel width of the solder foil that is used as the solder member 46 that bonds the metal block 44 to the metal plate 36 in the upper arm power unit 202 is substantially the same as the reel width of the solder foil that is used as the solder member 52 that bonds the metal block 50 to the metal plate 36.

Similarly, in the lower arm power unit 204, the reel width of the solder foil that is used as the solder member 42 that bonds the semiconductor switching element 210 to the metal block 44 is substantially the same as the reel width of the solder foil that is used as the solder member 48 that bonds the diode 212 to the metal block 50, and the reel width of the solder foil that is used as the solder member 46 that bonds the metal block 44 to the metal plate 56 is substantially the same as the reel width of the solder foil that is used as the solder member 52 that bonds the metal block 50 to the metal plate 56.

In this respect, in the semiconductor device 200, it is possible to use the same material for the solder foils that are attached as the solder members 42 respectively interposed between the semiconductor switching elements 206, 210 and the metal blocks 44 and for the solder foils that are attached as the solder members 48 respectively interposed between the diodes 208, 212 and the metal blocks 50. Therefore, it is possible to reduce the number of types of solder foil that is used in the semiconductor device 200. It is possible to use the same material for the solder foils that are attached as the solder members 46 respectively interposed between the metal blocks 44 and the metal plates 36, 56 and for the solder foils that are attached as the solder members 52 respectively interposed between the metal blocks 50 and the metal plates 36, 56. Therefore, it is possible to reduce the number of types of solder foil that is used in the semiconductor device 200.

With the structure of the semiconductor device 200 according to the present embodiment, the arrangement positional relationship between the semiconductor switching element 206-side solder member 46 and the diode 208-side solder member 52, which are arranged side by side in the second direction Y within the frame surrounded by the groove 70 of the metal plate 36 or the arrangement positional relationship between the semiconductor switching element 210-side solder member 46 and the diode 212-side solder member 52, which are arranged side by side in the second direction Y within the frame surrounded by the groove 72 of the metal plate 56, is allowed to be inverted within the frame surrounded by the corresponding one of the grooves 70, 72. That is, the semiconductor switching element 206 and the solder member 46 may be arranged on the metal plate 36 at the side in the second direction Y, at which the joint portion 36a is provided, and the diode 208 and the solder member 52 may be arranged at the side in the second direction Y, at which the joint portion 36a is not provided, or the semiconductor switching element 210 and the solder member 46 may be arranged on the metal plate 56 at the side in the second direction Y, at which the joint portion 56a is provided, and the diode 212 and the solder member 52 may be arranged at the side in the second direction Y, at which the joint portion 56a is not provided. Alternatively, the diode 208 and the solder member 52 may be arranged on the metal plate 36 at the side in the second direction Y, at which the joint portion 36a is provided and the semiconductor switching element 206 and the solder member 46 may be arranged at the side in the second direction Y, at which the joint portion 36a is not provided, or the diode 212 and the solder member 52 may be arranged on the metal plate 56 at the side in the second direction Y, at which the joint portion 56a is provided and the semiconductor switching element 210 and the solder member 46 may be arranged at the side in the second direction Y, at which the joint portion 56a is not provided.

Therefore, with the semiconductor device 200 according to the present embodiment as well, it is possible to commonalize the metal plate 36 that is used for the upper arm power unit 202 and the metal plate 56 that is used for the lower arm power unit 204, and it is possible to constitute both the upper arm power unit 202 and the lower arm power unit 204 by changing the order of arrangement of the semiconductor switching element 206 and the diode 208 and the order of arrangement of the semiconductor switching element 210 and the diode 212 in the second direction Y on the metal plates 36, 56 having the same shape. Therefore, it is possible to reduce the types of components (specifically the metal plates 36, 56) that are used in the semiconductor device 200 into only one-type component.

In the above-described second embodiment, the semiconductor switching elements 206, 210 and the diodes 208, 212 may be regarded as "semiconductor elements" according to the aspect of the invention.

Figure 13:
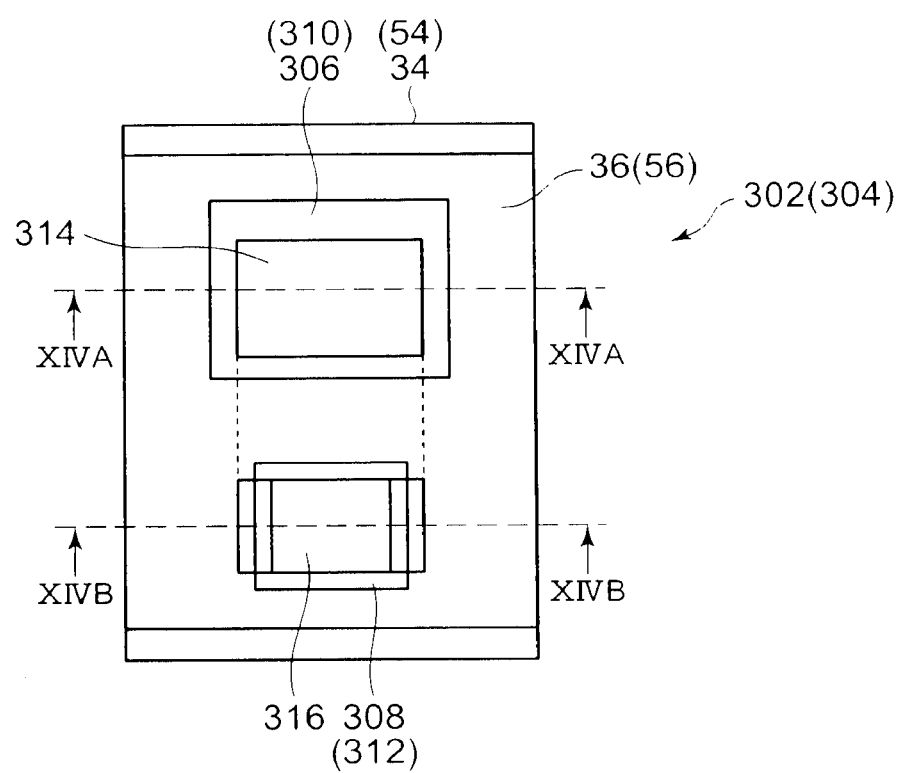
FIG. 13 is a layout plan of the configuration of a relevant portion of a semiconductor device according to a third embodiment of the invention.
Figure 14A:
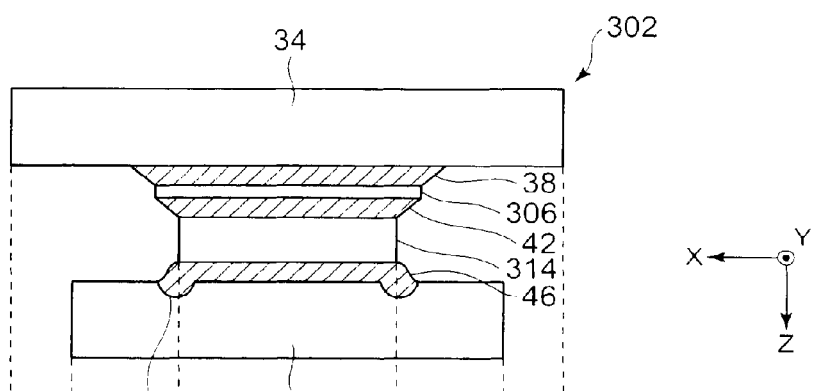
FIG. 14A and FIG. 14B are cross-sectional views of the semiconductor device according to the third embodiment, respectively taken along the line XIVA-XIVA and the line XIVB-XIVB in FIG. 13.
Figure 14B:
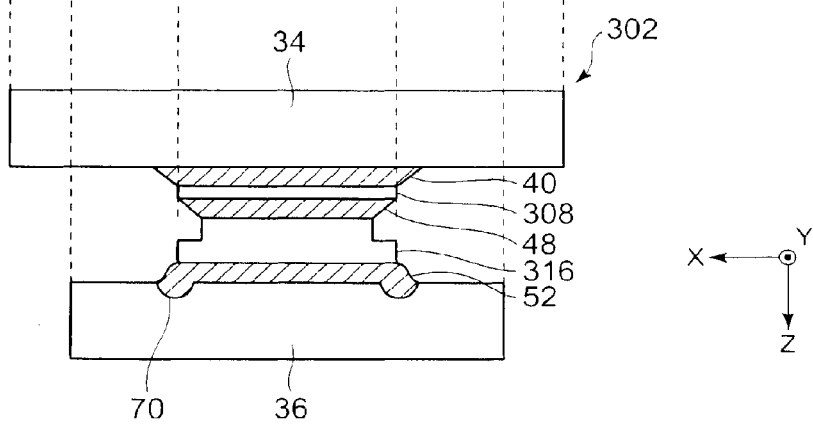

FIG. 13 is a layout plan of the configuration of a relevant portion of an upper arm power unit 302 and a lower arm power unit 304 of a semiconductor device 300 according to a third embodiment of the invention. FIG. 14A and FIG. 14B are cross-sectional views of the upper arm power unit 302 according to the present embodiment, taken along the line XIVA-XIVA and the line XIVB-XIVB in FIG. 13. FIG. 14A shows the cross-sectional view taken along the line XIVA-XIVA. FIG. 14B shows the cross-sectional view taken along the line XIVB-XIVB. In FIG. 13, FIG. 14A and FIG. 14B, like reference numerals denote the same components as those used in the above-described first embodiment, and the description thereof is omitted or simplified.

The semiconductor device 300 according to the present embodiment includes the upper arm power unit 302 and the lower arm power unit 304. The upper arm power unit 302 constitutes an upper arm that is connected to the high-potential power supply. The lower arm power unit 304 constitutes a lower arm that is connected to the low-potential power supply. The upper arm power unit 302 includes two different types of semiconductor elements 306, 308. The lower arm power unit 304 includes two different types of semiconductor elements 310, 312.

The semiconductor elements 306, 308, 310, 312 each are formed of a semiconductor chip formed in a thin rectangular shape, and respectively have the same configurations and functions as the semiconductor elements 26, 28, 30, 32 according to the above-described first embodiment except the widths thereof. The upper arm power unit 302 and the lower arm power unit 304 respectively have the same configurations and functions as the upper arm power unit 22 and the lower arm power unit 24 according to the first embodiment except the widths of the semiconductor elements 306, 308, 310, 312, the sizes of solder members associated with the widths, and the like.

The width of the semiconductor switching element 306 in the first direction X is different from the width of the diode 308 in the first direction X. The width of the semiconductor switching element 310 in the first direction X is different from the width of the diode 312 in the first direction X. Specifically, the width of the diode 308 in the first direction X is smaller than the width of the semiconductor switching element 306 in the first direction X, and the width of the diode 312 in the first direction X is smaller than the width of the semiconductor switching element 310 in the first direction X.

In the upper arm power unit 302, one face of the semiconductor switching element 306 is bonded to the metal plate 34 via the solder member 38. One face of the diode 308 is bonded to the metal plate 34 via the solder member 40. The other face of the semiconductor switching element 306 is bonded to the metal plate 36 via the solder member 42, a metal block 314 and the solder member 46. The other face of the diode 308 is bonded to the metal plate 36 via the solder member 48, a metal block 316 and the solder member 52.

In the lower arm power unit 304, one face of the semiconductor switching element 310 is bonded to the metal plate 54 via the solder member 38. One face of the diode 312 is bonded to the metal plate 54 via the solder member 40. The other face of the semiconductor switching element 310 is bonded to the metal plate 56 via the solder member 42, the metal block 314 and the solder member 46. The other face of the diode 312 is bonded to the metal plate 36 via the solder member 48, the metal block 316 and the solder member 52.

The metal block 314 has a size designed for the size of the semiconductor switching element 306 or the semiconductor switching element 310, and is formed in substantially a rectangular parallelepiped shape as shown in FIG. 14A. The metal block 316 has a size designed for the size of the diode 308 or the diode 312, but the metal block 316 is formed in a shape different from the shape of the metal block 314.

That is, the shape of the metal block 314 is different from the shape of the metal block 316. The shape of the metal block 314 is substantially a rectangular parallelepiped shape, while the shape of the metal block 316 is a protruded shape in cross section as shown in FIG. 14B. The metal block 316 is formed as follows. The width of a portion in the first direction X, at which the metal plate 36-side solder member 52 is provided, is substantially the same as the width of the metal block 314 in the first direction X, and the width of a portion in the first direction X, at which the metal plate 56-side solder member 52 is provided, is substantially the same as the width of the metal block 314 in the first direction X. On the other hand, the width of a portion in the first direction X, at which the diode 308-side solder member 48 is provided, is designed for the width of the diode 308 in the first direction X and is smaller than the width of a portion in the first direction X, at which the metal plate 36-side solder member 52 is provided (that is, the width of the metal block 314 in the first direction X), and the width of a portion in the first direction X, at which the diode 312-side solder member 48 is provided, is designed for the width of the diode 312 in the first direction X and is smaller than the width of a portion in the first direction X, at which the metal plate 56-side solder member 52 is provided (that is, the width of the metal block 314 in the first direction X).

In this respect, in the upper arm power unit 302, the width of the metal block 314 in the first direction X is substantially the same as the width of the portion of the metal block 316 in the first direction X, at which the metal plate 36-side solder member 52 is provided. In the lower arm power unit 304, the width of the metal block 314 in the first direction X is substantially the same as the width of the portion of the metal block 316 in the first direction X, at which the metal plate 56-side solder member 52 is provided.

In the upper arm power unit 302, the semiconductor switching element 306 and the diode 308 are arranged side by side in the second direction Y on the metal plates 34, 36, the metal block 314 is laminated on the semiconductor element 306, and the metal block 316 is laminated on the semiconductor element 308. The metal block 314 is laminated on the semiconductor switching element 306 such that the metal block 314 is located at substantially the center in the first direction X with respect to the semiconductor element 306. The metal block 316 is laminated on the diode 308 such that the metal block 316 is located at substantially the center in the first direction X with respect to the semiconductor element 308. These metal blocks 314, 316 are arranged side by side in the second direction Y on the metal plates 34, 36 such that the ends in the first direction X are aligned with each other without any offset in the first direction X.

In the lower arm power unit 304, the semiconductor switching element 310 and the diode 312 are arranged side by side in the second direction Y on the metal plates 54, 56, the metal block 314 is laminated on the semiconductor element 310, and the metal block 316 is laminated on the semiconductor element 312. The metal block 314 is laminated on the semiconductor switching element 310 such that the metal block 314 is located at substantially the center in the first direction X with respect to the semiconductor element 310. The metal block 316 is laminated on the diode 312 such that the metal block 316 is located at substantially the center in the first direction X with respect to the semiconductor element 312. These metal blocks 314, 316 are arranged side by side in the second direction Y on the metal plates 54, 56 such that the ends in the first direction X are aligned with each other without any offset in the first direction X.

The groove 70 formed on the bonding face of the metal plate 36 is formed on the bonding face along the outer peripheries of the regions 80, 82 in which the solder members 46, 52 are provided, and is formed in an annular and frame shape so as to collectively surround the solder member 46 corresponding to the semiconductor switching element 306-side metal block 314 and the solder member 52 corresponding to the diode 308-side metal block 316. The groove 72 formed on the bonding face of the metal plate 56 is formed on the bonding face along the outer peripheries of the regions 84, 86 in which the solder members 46, 52 are provided, and is formed in an annular and frame shape so as to collectively surround the solder member 46 corresponding to the semiconductor switching element 310-metal block 314 and the solder member 52 corresponding to the diode 312-side metal block 316.

The distance between portions of the groove 70 on both sides of the metal block 314 in the first direction X on the metal plate 36 is substantially the same as the distance between portions of the groove 70 on both sides of the metal block 316 in the first direction X on the metal plate 36. The width of the region 80 on the metal plate 36 in the first direction X is substantially the same as the width of the region 82 on the metal plate 36 in the first direction X. The solder member 46 is provided in the region 80. The solder member 52 is provided in the region 82. The groove 70 is an annular groove that is formed in substantially a rectangular shape collectively surrounding the solder members 46, 52 on the bonding face of the metal plate 36, and is continuous around the regions 80, 82 of the metal plate 36, in which the solder members 46, 52 are respectively provided.

The distance between portions of the groove 72 on both sides of the metal block 314 in the first direction X on the metal plate 56 is substantially the same as the distance between portions of the groove 72 on both sides of the metal block 316 in the first direction X on the metal plate 56. The width of the region 84 on the metal plate 56 in the first direction X is substantially the same as the width of the region 86 on the metal plate 56 in the first direction X. The solder member 46 is provided in the region 84. The solder member 52 is provided in the region 86. The groove 72 is an annular groove that is formed in substantially a rectangular shape collectively surrounding the solder members 46, 52 on the bonding face of the metal plate 56, and is continuous around the regions 84, 86 of the metal plate 56, in which the solder members 46, 52 are respectively provided.

In the structure of the semiconductor device 300 according to the present embodiment, the groove 70 of the upper arm power unit 302 prevents spreading of both the semiconductor switching element 306-side solder member 46 and the diode 308-side solder member 52. The groove 72 of the lower arm power unit 304 prevents spreading of both the semiconductor switching element 310-side solder member 46 and the diode 312-side solder member 52. With the above configuration as well, a groove corresponding to the solder member 46 and a groove corresponding to the solder member 52 do not need to be provided individually for the region in which the semiconductor switching element 306-side solder member 46 is provided and the region in which the diode 308-side solder member 52 is provided on the bonding face of the metal plate 36 or for the region in which the semiconductor switching element 310-side solder member 46 is provided and the region in which the diode 312-side solder member 52 is provided on the bonding face of the metal plate 56.

Therefore, with the semiconductor device 300 according to the present embodiment as well, it is possible to reduce the width of each of the metal plates 34, 36 in the second direction Y, on which the two types of semiconductor elements 306, 308 of the upper arm power unit 302 are arranged side by side in the second direction Y, and the width of each of the metal plates 54, 56 in the second direction Y, on which the two types of semiconductor elements 310, 312 of the lower arm power unit 304 are arranged side by side in the second direction Y. Therefore, it is possible to reduce the size and weight of each of the metal plates 34, 36, 54, 56, and, by extension, it is possible to reduce the size and weight of the semiconductor device 300 itself.

In the structure of the semiconductor device 300, the reel width of the solder foil that is used as the solder member 46 that bonds the metal block 314 to the metal plate 36 in the upper arm power unit 302 is substantially the same as the reel width of the solder foil that is used as the solder member 52 that bonds the metal block 316 to the metal plate 36. Similarly, in the lower arm power unit 304, the reel width of the solder foil that is used as the solder member 46 that bonds the metal block 314 to the metal plate 56 is substantially the same as the reel width of the solder foil that is used as the solder member 52 that bonds the metal block 316 to the metal plate 56.

In this respect, with the semiconductor device 300 according to the present embodiment as well, it is possible to use the same material for the solder foils that are attached as the solder members 46 respectively interposed between the metal blocks 314 and the metal plates 36, 56 and for the solder foils that are attached as the solder members 52 respectively interposed between the metal blocks 316 and the metal plates 36, 56. Therefore, it is possible to reduce the number of types of solder foil that is used in the semiconductor device 300.

With the structure of the semiconductor device 300 according to the present embodiment, the arrangement positional relationship between the semiconductor switching element 306-side solder member 46 and the diode 308-side solder member 52, which are arranged side by side in the second direction Y within the frame surrounded by the groove 70 of the metal plate 36 or the arrangement positional relationship between the semiconductor switching element 310-side solder member 46 and the diode 312-side solder member 52, which are arranged side by side in the second direction Y within the frame surrounded by the groove 72 of the metal plate 56, is allowed to be inverted within the frame surrounded by the corresponding one of the grooves 70, 72. That is, the semiconductor switching element 306 and the solder member 46 may be arranged on the metal plate 36 at the side in the second direction Y, at which the joint portion 36a is provided, and the diode 308 and the solder member 52 may be arranged at the side in the second direction Y, at which the joint portion 36a is not provided, or the semiconductor switching element 310 and the solder member 46 may be arranged on the metal plate 56 at the side in the second direction Y, at which the joint portion 56a is provided, and the diode 312 and the solder member 52 may be arranged at the side in the second direction Y, at which the joint portion 56a is not provided. Alternatively, the diode 308 and the solder member 52 may be arranged on the metal plate 36 at the side in the second direction Y, at which the joint portion 36a is provided and the semiconductor switching element 306 and the solder member 46 may be arranged at the time in the second direction Y, at which the joint portion 36a is not provided, or the diode 312 and the solder member 52 may be arranged on the metal plate 56 at the side in the second direction Y, at which the joint portion 56a is provided and the semiconductor switching element 310 and the solder member 46 may be arranged at the side in the second direction Y, at which the joint portion 56a is not provided.

Therefore, with the semiconductor device 300 according to the present embodiment as well, it is possible to commonalize the metal plate 36 that is used for the upper arm power unit 302 and the metal plate 56 that is used for the lower arm power unit 304, and it is possible to constitute both the upper arm power unit 302 and the lower arm power unit 304 by changing the order of arrangement of the semiconductor switching element 306 and the diode 308 and the order of arrangement of the semiconductor switching element 310 and the diode 312 in the second direction Y on the metal plates 36, 56 having the same shape. Therefore, it is possible to reduce the types of components (specifically the metal plates 36, 56) that are used in the semiconductor device 300 into only one-type component.

In the above-described third embodiment, the semiconductor switching elements 306, 310 and the diodes 308, 312 may be regarded as "semiconductor elements" according to the aspect of the invention.

Incidentally, in the above-described third embodiment, the metal block 316 of each of the upper arm power unit 302 and the lower arm power unit 304 is formed in a shape different from the shape of the metal block 314 formed in substantially a rectangular parallelepiped shape, and is specifically formed in a protruded shape in cross section. However, the invention is not limited to this shape. The metal block 316 just needs to be formed such that the width of a portion in the first direction X, at which the diode 308-side solder member 48 or the diode 312-side solder member 48 is provided, is smaller than the width of a portion in the first direction X, at which the metal plate 36-side solder member 52 or the metal plate 56-side solder member 52, designed for the width of the diode 308 or the diode 312 in the first direction X is provided (that is, the width of the metal block 314 in the first direction X), and may be, for example, formed in a tapered shape in cross section as shown in FIG. 15.

In the above-described first to third embodiments, each of the arm power units includes the two semiconductor elements. Instead, each of the arm power units may include three or more semiconductor elements. Each of the arm power units includes two different types of semiconductor elements. Instead, each of the arm power units may include semiconductor elements of the same type. For example, each of the arm power units may include two semiconductor switching elements and a single diode. Conversely, each of the arm power units may include a single semiconductor switching element and two diodes. The semiconductor switching element and the diode are used as the two different types of semiconductor elements of each of the arm power units. Instead, another combination of semiconductor elements may be used as the two different types of semiconductor elements of each of the arm power units.

In the above-described first to third embodiments, the two types of semiconductor elements of each arm power unit are bonded to each of the metal plates 34, 54 via the independent separate solder members 38, 40. That is, the solder members 38, 40 that respectively bond the two semiconductor elements to the bonding face of the same metal plate 34 or the metal plate 54 are separated and independent of each other. The metal blocks corresponding to the two types of semiconductor elements are bonded to each of the metal plates 36, 56 via the independent separate solder members 46, 52. That is, the solder members 46, 52 that bond the two metal blocks to the bonding face of each of the same metal plates 36, 56 are separated and independent of each other. The invention is not limited to this configuration. The above-described solder members 38, 40 may be integrated with each other or the above-described solder members 46, 52 may be integrated with each other.

In the above-described first to third embodiments, the two metal blocks provided in correspondence with the two types of semiconductor elements of each arm power unit are separated and independent of each other. The invention is not limited to this configuration. Two metal blocks corresponding to the two types of semiconductor elements may be integrated with each other.

In the above-described first to third embodiments, the groove 70 formed on the bonding face of the metal plate 36 is formed along the outer peripheries of the regions 80, 82 in which the solder members 46, 52 are provided, the groove 72 formed on the bonding face of the metal plate 56 is formed along the outer peripheries of the regions 84, 86 in which the solder members 46, 52 are provided, the groove 70 is formed in an annular and frame shape so as to collectively surround the semiconductor switching element-side solder member 46 and the diode-side solder member 52, and the groove 72 is formed in an annular and frame shape so as to collectively surround the semiconductor switching element-side solder member 46 and the diode-side solder member 52. The invention is not limited to this configuration. The groove 70 may be formed so as to include an annular portion 70a formed in the annular and frame shape and, as shown in FIG. 16A, extend in the first direction X between the region 80 in which the semiconductor switching element-side solder member 46 is provided and the region 82 in which the diode-side solder member 52 is provided on the bonding face of the metal plate 36 and include a shared portion 70b into which both the solder members 46, 52 are allowed to flow in. The groove 72 may be formed so as to include an annular portion 72a formed in the annular and frame shape and, as shown in FIG. 16A, extend in the first direction X between the region 84 in which the semiconductor switching element-side solder member 46 is provided and the region 86 in which the diode-side solder member 52 is provided on the bonding face of the metal plate 56 and include a shared portion 72b into which both the solder members 46, 52 are allowed to flow in.

In the above-described first to third embodiments, irrespective of whether the width of the semiconductor switching element in the first direction X is substantially the same as or different from the width of the diode in the first direction X, the groove 70 formed on the bonding face of the metal plate 36 is an annular groove formed in substantially a rectangular shape collectively surrounding the solder members 46, 52, and the groove 72 formed on the bonding face of the metal plate 56 is an annular groove formed in substantially a rectangular shape collectively surrounding the solder members 46, 52. The invention is not limited to this configuration. When the width of the semiconductor switching element in the first direction X is different from the width of the diode in the first direction X, the shape of the groove 70 may have a recess or a protrusion so as to be designed for each of the semiconductor switching element-side width and the diode-side width on the bonding face of the metal plate 36, and the shape of the groove 72 may have a recess or a protrusion so as to be designed for each of the semiconductor switching element-side width and the diode-side width on the bonding face of the metal plate 56, as shown in FIG. 16B.

In the above-described first to third embodiments, the groove 70 formed on the bonding face of the metal plate 36 is continuous on the outer peripheries of the regions 80, 82 of the metal plate 36 in which the solder members 46, 52 are provided, and the groove 72 formed on the bonding face of the metal plate 56 is continuous on the outer peripheries of the regions 84, 86 of the metal plate 56 in which the solder members 46, 52 are provided. The invention is not limited to this configuration. The groove 70 may be intermittently continuous on the outer peripheries of the regions 80, 82 of the metal plate 36 in which the solder members 46, 52 are provided, and the groove 72 may be intermittently continuous on the outer peripheries of the regions 84, 86 of the metal plate 56 in which the solder members 46, 52 are provided, as shown in FIG. 16C. The groove 70 may be formed in substantially an annular shape on the outer peripheries of the regions 80, 82 of the metal plate 36 in which the solder members 46, 52 are provided, and may be not continuous in an annular shape with part being cut. The groove 72 may be formed in substantially an annular shape on the outer peripheries of the regions 84, 86 of the metal plate 56 in which the solder members 46, 52 are provided, and may be not continuous in an annular shape with part being cut.

In the above-described first to third embodiments, the two types of semiconductor elements of the upper arm power unit are arranged side by side in the second direction Y on the metal plates 34, 36 and arranged such that the ends in the first direction X are aligned with each other without any offset in the first direction X, and the two types of semiconductor elements of the lower arm power unit are arranged side by side in the second direction Y on the metal plates 54, 56 and arranged such that the ends in the first direction X are aligned with each other without any offset in the first direction X. The invention is not limited to this configuration. Two types of semiconductor elements arranged side by side in the second direction Y on the metal plates 34, 36 may be arranged such that the ends in the first direction X deviate from each other with an offset in the first direction X, and two types of semiconductor elements arranged side by side in the second direction Y on the metal plates 54, 56 may be arranged such that the ends in the first direction X deviate from each other with an offset in the first direction X. In the above alternative embodiment, the groove 70 is formed at a position designed for the arrangement positions of the two types of semiconductor elements on the bonding face of the metal plate 36, and the groove 72 is formed at a position designed for the arrangement positions of the two types of semiconductor elements on the bonding face of the metal plate 56

Figure 17A:
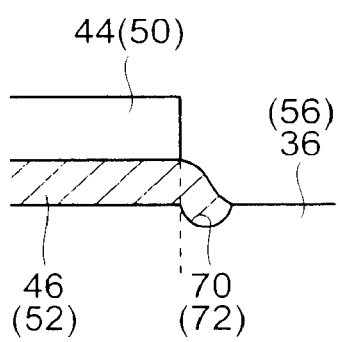
FIG. 17A and FIG. 17B are enlarged cross-sectional views of relevant portions of semiconductor devices according to alternative embodiments of the invention.
Figure 17B:
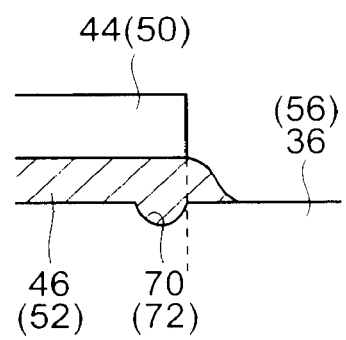

In the above-described first to third embodiments, the groove 70 formed on the bonding face of the metal plate 36 is formed along the outer peripheries of the regions 80, 82 in which the solder members 46, 52 are provided, and the groove 72 formed on the bonding face of the metal plate 56 is formed along the outer peripheries of the regions 84, 86 in which the solder members 46, 52 are provided. The groove 70 may be formed on the bonding face of the metal plate 36 so as to span between the inner side and outer side of the outer peripheral end of each of the metal blocks 44, 314 bonded via the solder members 46, 52 (FIG. 6), may be formed on the outer side of the outer peripheral end of each of the metal blocks 44, 314 (FIG. 17A) or may be formed on the inner side of the outer peripheral end of each of the metal blocks 44, 314 (FIG. 17B). The groove 72 may be formed on the bonding face of the metal plate 56 so as to span between the inner side and outer side of the outer peripheral end of each of the metal blocks 50, 316 bonded via the solder members 46, 52 (FIG. 6), may be formed on the outer side of the outer peripheral end of each of the metal blocks 50, 316 (FIG. 17A) or may be formed on the inner side of the outer peripheral end of each of the metal blocks 50, 316 (FIG. 17B).

The invention claimed is:

1. A semiconductor device comprising:
opposed first and second metal plates;
a plurality of semiconductor elements each interposed between the first metal plate and the second metal plate;
a metal block interposed between the first metal plate and each of the semiconductor elements;
a solder member interposed between the first metal plate and the metal block and connecting the first metal plate to the metal block; and
a resin molding sealing the semiconductor elements and the metal block between the first metal plate and the second metal plate, wherein
a face of the first metal plate, which is on an opposite side of a face of the first metal plate to which the metal block is connected via the solder member, is exposed from the resin molding,
the first metal plate has a groove formed along an outer periphery of a region in which the solder member is provided, the groove collectively surrounding the solder member,
the groove is an annular groove formed in substantially a rectangular shape,
the plurality of semiconductor elements are two types of first and second semiconductor elements arranged side by side in a predetermined direction between the first metal plate and the second metal plate,
a width of a first region on the first metal plate in a perpendicular direction perpendicular to the predetermined direction is substantially equal to a width of a second region on the first metal plate in the perpendicular direction, the solder member corresponding to the metal block at the first semiconductor element being provided in the first region, the solder member corresponding to the metal block at the second semiconductor element being provided in the second region, and a width of the first semiconductor element in the perpendicular direction is substantially equal to a width of the second semiconductor element in the perpendicular direction.

2. A semiconductor device comprising:
opposed first and second metal plates;
a plurality of semiconductor elements each interposed between the first metal plate and the second metal plate;
a metal block interposed between the first metal plate and each of the semiconductor elements;
a solder member interposed between the first metal plate and the metal block and connecting the first metal plate to the metal block; and
a resin molding sealing the semiconductor elements and the metal block between the first metal plate and the second metal plate, wherein
a face of the first metal plate, which is on an opposite side of a face of the first metal plate to which the metal block is connected via the solder member, is exposed from the resin molding,
the first metal plate has a groove formed along an outer periphery of a region in which the solder member is provided, the groove collectively surrounding the solder member,
the groove is an annular groove formed in substantially a rectangular shape,
the plurality of semiconductor elements are two types of first and second semiconductor elements arranged side by side in a predetermined direction between the first metal plate and the second metal plate,
a width of a first region on the first metal plate in a perpendicular direction perpendicular to the predetermined direction is substantially equal to a width of a second region on the first metal plate in the perpendicular direction, the solder member corresponding to the metal block at the first semiconductor element being provided in the first region, the solder member corresponding to the metal block at the second semiconductor element being provided in the second region,
a width of a first portion of the metal block at the first semiconductor element in the perpendicular direction, at least the corresponding solder member being provided at the first portion, is substantially equal to a width of a second portion of the metal block at the second semiconductor element in the perpendicular direction, at least the corresponding solder member being provided at the second portion,
a width of the first semiconductor element in the perpendicular direction is different from a width of the second semiconductor element in the perpendicular direction, and the shape of the metal block at the first semiconductor element is different from the shape of the metal block at the second semiconductor element,
the shape of the metal block at the first semiconductor element is substantially a rectangular parallelepiped shape, and
the shape of the metal block at the second semiconductor element is a tapered shape in cross section.

3. A semiconductor device comprising:
opposed first and second metal plates;
a plurality of semiconductor elements each interposed between the first metal plate and the second metal plate;
a metal block interposed between the first metal plate and each of the semiconductor elements;
a solder member interposed between the first metal plate and the metal block and connecting the first metal plate to the metal block; and a resin molding sealing the semiconductor elements and the metal block between the first metal plate and the second metal plate, wherein a face of the first metal plate, which is on an opposite side of a face of the first metal plate to which the metal block is connected via the solder member, is exposed from the resin molding, the first metal plate has a groove formed along an outer periphery of a region in which the solder member is provided, the groove collectively surrounding the solder member, the groove is an annular groove formed in substantially a rectangular shape, the plurality of semiconductor elements are two types of first and second semiconductor elements arranged side by side in a predetermined direction between the first metal plate and the second metal plate, a width of a first region on the first metal plate in a perpendicular direction perpendicular to the predetermined direction is substantially equal to a width of a second region on the first metal plate in the perpendicular direction, the solder member corresponding to the metal block at the first semiconductor element being provided in the first region, the solder member corresponding to the metal block at the second semiconductor element being provided in the second region, and a distance at which the first semiconductor element and the second semiconductor element are spaced apart from each other in the predetermined direction between the first metal plate and the second metal plate is at least larger than a width of the metal block in a lamination direction.

* * * * *